United States Patent
Kim et al.

(10) Patent No.: US 11,847,032 B2
(45) Date of Patent: Dec. 19, 2023

(54) SOLID STATE DRIVE, ELECTRONIC DEVICE INCLUDING SOLID STATE DRIVE, AND METHOD OF MANAGING SOLID STATE DRIVE

(71) Applicant: SAMSUNG ELECTRONICS CO., LTD., Suwon-si (KR)

(72) Inventors: Sung-Wook Kim, Suwon-si (KR); So-Geum Kim, Suwon-si (KR); Daehun You, Seoul (KR); Jaehwan Lim, Seongnam-si (KR)

(73) Assignee: Samsung Electronics Co., Ltd.

( * ) Notice: Subject to any disclaimer, the term of this patent is extended or adjusted under 35 U.S.C. 154(b) by 439 days.

(21) Appl. No.: 17/208,312

(22) Filed: Mar. 22, 2021

(65) Prior Publication Data
US 2022/0012141 A1   Jan. 13, 2022

(30) Foreign Application Priority Data
Jul. 13, 2020   (KR) .................. 10-2020-0086230

(51) Int. Cl.
*G11C 7/00*   (2006.01)
*G06F 11/20*  (2006.01)
(Continued)

(52) U.S. Cl.
CPC ............ *G06F 11/2015* (2013.01); *G06F 1/28* (2013.01); *G06F 1/3221* (2013.01);
(Continued)

(58) Field of Classification Search
CPC ... G11C 7/04; G11C 11/406; G11C 11/40626; G11C 5/04; G11C 5/143
(Continued)

(56) References Cited

U.S. PATENT DOCUMENTS 8,458,804 B1   6/2013   Hyde et al.
9,250,820 B2   2/2016   Salessi et al.
(Continued)

FOREIGN PATENT DOCUMENTS

KR   10-2017-0056936 A   5/2017
KR   10-2020-0015274 A   2/2020

OTHER PUBLICATIONS

Xu et al., "Lessons and Actions: What We Learned from 10K SSE-Related Storage System Failures," 2019 USENIX Annual Technical Conference.

*Primary Examiner* — Son T Dinh
(74) *Attorney, Agent, or Firm* — Fish & Richardson P.C.

(57) ABSTRACT

An electronic device includes: a power supply to supply a first power and a second power; a first solid state drive (SSD) backplane and a second SSD backplane to receive the first power from the power supply, each of the first solid state drive (SSD) backplane and the second SSD backplane including two or more SSDs; and a baseboard to receive the second power from the power supply, to independently power on and power off the first SSD backplane and the second SSD backplane, and to access the SSDs of an SSD backplane that is in a power-on state from among the first SSD backplane and the second SSD backplane. In response to an increase in temperature of an SSD backplane that is in a power-off state, at least one SSD of the SSD backplane that is in the power-off state may be powered on.

20 Claims, 16 Drawing Sheets

(51) Int. Cl.
   *G06F 1/28*       (2006.01)
   *G11C 11/406*     (2006.01)
   *G11C 16/34*      (2006.01)
   *G06F 1/3221*     (2019.01)
   *G11C 13/00*      (2006.01)

(52) U.S. Cl.
   CPC .... *G11C 11/40626* (2013.01); *G11C 13/0038* (2013.01); *G11C 16/349* (2013.01); *G11C 16/3418* (2013.01); *G06F 2201/85* (2013.01)

(58) Field of Classification Search
   USPC ........................................................ 365/211
   See application file for complete search history.

(56) References Cited

U.S. PATENT DOCUMENTS

| | | |
|---|---|---|
| 9,571,128 B2 | 2/2017 | Chunn et al. |
| 10,117,363 B2 | 10/2018 | Yokoyama et al. |
| 2013/0208419 A1 | 8/2013 | Li |
| 2017/0140825 A1 | 5/2017 | Park et al. |
| 2017/0315599 A1 | 11/2017 | Marripudi et al. |
| 2020/0034068 A1 | 1/2020 | Masubuchi |
| 2020/0042207 A1 | 2/2020 | Kwak et al. |
| 2022/0283912 A1* | 9/2022 | Jung ................... G11C 29/765 |

* cited by examiner

FIG. 13

| PE cycle | Critical Value | Cautious Value |
|---|---|---|
| 0.1K | 80 | 70 |
| 1K | 70 | 60 |
| 3K | 60 | 50 |
| 5K | 50 | 40 |
| 7K | 40 | 30 |
| 10K | 30 | 20 |

SOLID STATE DRIVE, ELECTRONIC DEVICE INCLUDING SOLID STATE DRIVE, AND METHOD OF MANAGING SOLID STATE DRIVE

CROSS-REFERENCE TO RELATED APPLICATIONS

Korean Patent Application No. 10-2020-0086230, filed on Jul. 13, 2020, in the Korean Intellectual Property Office, and entitled: "Solid State Drive, Electronic Device Including Solid State Drive, and Method of Managing Solid State Drive," is incorporated by reference herein in its entirety.

BACKGROUND

1. Field

Embodiments relate to an electronic device, and more particular, relate to a solid state drive, an electronic device including the solid state drive, and a method of managing the solid state drive.

2. Description of the Related Art

A solid state drive may include a nonvolatile memory. The solid state drive may store data in the nonvolatile memory, and provide data read from the nonvolatile memory. The nonvolatile memory may include a flash memory, a phase-change memory, a ferroelectric memory, a magnetic memory, a resistive memory, and the like.

SUMMARY

Embodiments are directed to an electronic device, including: a power supply configured to supply a first power and a second power; a first solid state drive (SSD) backplane and a second SSD backplane configured to receive the first power from the power supply, each of the first solid state drive (SSD) backplane and the second SSD backplane including two or more SSDs; and a baseboard configured to receive the second power from the power supply, to independently power on and power off the first SSD backplane and the second SSD backplane, and to access the SSDs of an SSD backplane that is in a power-on state from among the first SSD backplane and the second SSD backplane. In response to an increase in temperature of an SSD backplane that is in a power-off state from among the first SSD backplane and the second SSD backplane, at least one SSD of the SSD backplane that is in the power-off state may be powered on.

Embodiments are also directed to a method of managing a solid state drive (SSD), the method including: powering off the SSD; powering on the SSD in response to an increase in an ambient temperature of the SSD; and performing a retention recovery operation at the SSD.

Embodiments are also directed to a solid state drive, including: a nonvolatile memory device including a plurality of memory blocks each including a plurality of memory cells; and a controller including a temperature sensor and configured to perform a retention recovery operation on the plurality of memory blocks when a temperature sensed by the temperature sensor is greater than a critical value. In a power-on, the controller may perform the retention recovery operation in response to no communication initialization with an external host device, or, after the power-on, the controller may perform the retention recovery operation in response to a request of the external host device.

BRIEF DESCRIPTION OF THE FIGURES

Features will become apparent to those of skill in the art by describing in detail example embodiments with reference to the attached drawings in which:

FIG. 13 illustrates an example of program/erase cycles and adjusted critical values as an example of wear information.

DETAILED DESCRIPTION

Figure 1:
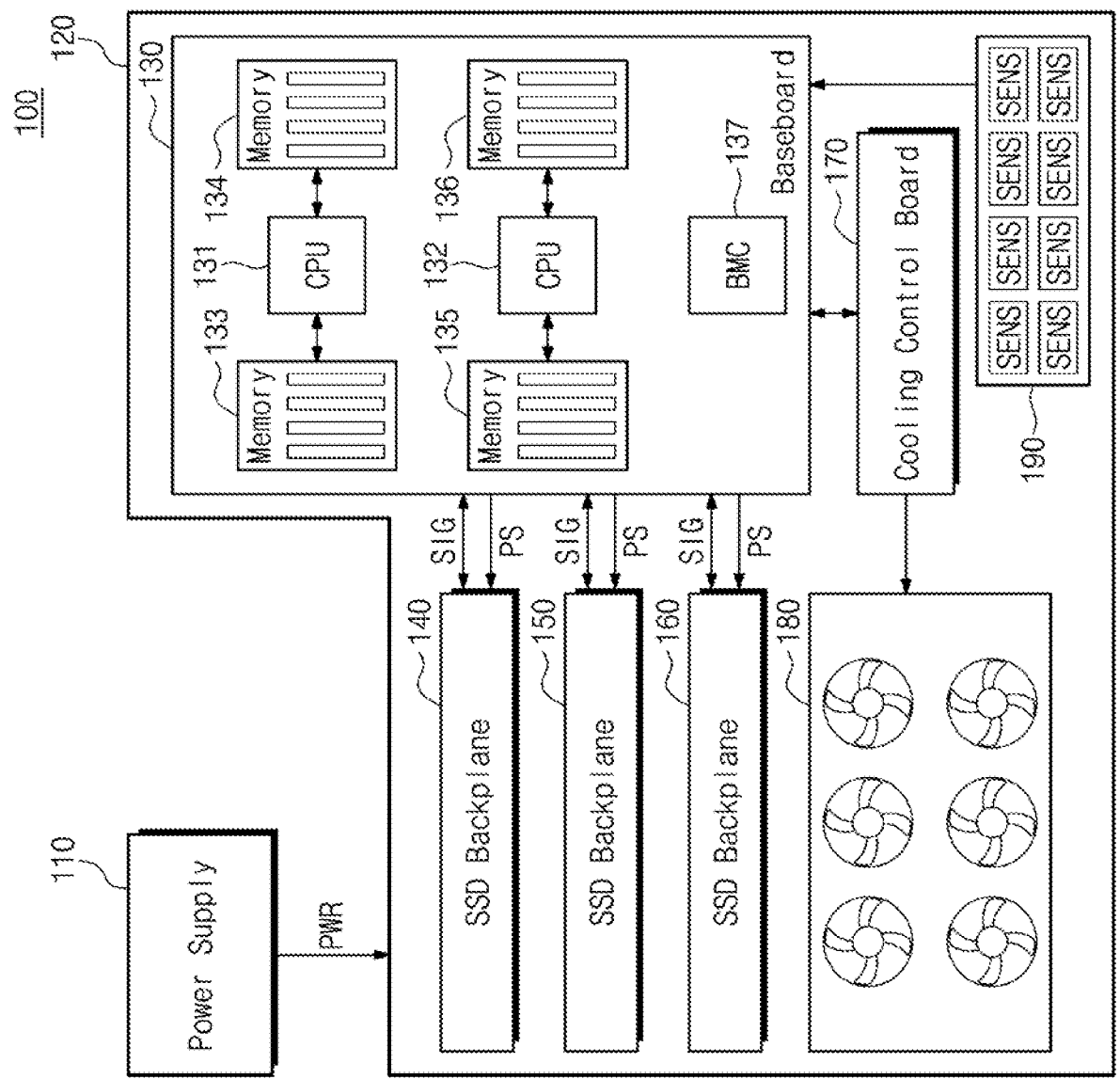
FIG. 1 illustrates an electronic device according to an example embodiment.

FIG. 1 illustrates an electronic device 100 according to an example embodiment.

Referring to FIG. 1, the electronic device 100 may be, e.g., a server. The electronic device 100 may include a power supply 110 and a power receiver 120. The power supply 110 may generate a power PWR from an external power, and may supply the generated power PWR to the power receiver 120. The power PWR may be provided in the form of two or more different voltages.

The power receiver 120 may receive the power PWR from the power supply 110, and may operate based on the power PWR. The power receiver 120 may include a baseboard 130, a first solid state drive (SSD) backplane 140, a second SSD backplane 150, a third SSD backplane 160, a cooling control board 170, coolers 180, and sensors 190.

The baseboard 130 may include a first central processing unit (CPU) 131, a second CPU 132, first memories 133 and second memories 134 connected with the first CPU 131, third memories 135 and fourth memories 136 connected with the second CPU 132, and a baseboard management controller (BMC) 137. The baseboard 130 may supply the power PWR received from the power supply 110 to the first CPU 131, the second CPU 132, the first memories 133, the second memories 134, the third memories 135, and the fourth memories 136.

The first CPU 131 may use the first memories 133 and the second memories 134 as working memories. The second CPU 132 may use the third memories 135 and the fourth memories 136 as working memories. The first CPU 131 and the second CPU 132 may execute an operating system and various applications. The first CPU 131 and the second CPU 132 may control components of the power receiver 120. For example, the first CPU 131 and the second CPU 132 may control the components of the power receiver 120 based on PCIe.

The first CPU 131 and the second CPU 132 may access the first SSD backplane 140, the second SSD backplane 150, and the third SSD backplane 160. For example, the first CPU 131 and the second CPU 132 may access the first SSD backplane 140, the second SSD backplane 150, and the third SSD backplane 160 based on NVMe. The first memories 133, the second memories 134, the third memories 135, and the fourth memories 136 may include DIMM memories installed in DIMM slots.

The BMC 137 may be a separate system that is separate from an operating system of the first CPU 131 and the second CPU 132. The BMC 137 may collect information from the components of the electronic device 100, and may access the components. The BMC 137 may be based on a separate communication interface that is separate from communication interfaces (e.g., PCIe) of the first CPU 131 and the second CPU 132. For example, the BMC 137 may be based on an intelligent platform management interface (IPMI). The communication interface of the BMC 137 may communicate with the communication interfaces of the first CPU 131 and the second CPU 132.

The first SSD backplane 140 may receive the power PWR from the power supply 110, may exchange signals SIG with the baseboard 130, and may receive power signals PS from the baseboard 130. The first SSD backplane 140 may exchange the signals SIG with the first CPU 131, the second CPU 132, or the BMC 137 of the baseboard 130, and may receive the power signals PS therefrom. A plurality of SSDs may be installed in the first SSD backplane 140. This may mean that the first SSD backplane 140 includes a plurality of SSDs.

The first CPU 131 and the second CPU 132 of the baseboard 130 may access (e.g., write, read, and erase) the SSDs of the first SSD backplane 140 through the signals SIG. The BMC 137 of the baseboard 130 may monitor the first SSD backplane 140 through the signals SIG, and may access and control the first SSD backplane 140. The first CPU 131, the second CPU 132, or the BMC 137 of the baseboard 130 may power on or power off the first SSD backplane 140 by using the power signals PS.

Structures and operations of the second SSD backplane 150 and the third SSD backplane 160 may be the same as the structure and the operation of the first SSD backplane 140. Thus, additional description will be omitted to avoid redundancy.

The baseboard 130 may power on and power off the first SSD backplane 140, the second SSD backplane 150, and the third SSD backplane 160 independently of each other. For example, services that are supported by using the first SSD backplane 140, the second SSD backplane 150, and the third SSD backplane 160 may be different. While the electronic device 100 does not provide a specific service, an SSD backplane corresponding to the specific service may be powered off, and the remaining SSD backplane(s) may be powered on.

For example, the frequencies of use of the services that are supported by using the first SSD backplane 140, the second SSD backplane 150, and the third SSD backplane 160 may be different for each time zone. In a time zone when the frequencies of use of the services that are supported by using the first SSD backplane 140, the second SSD backplane 150, and the third SSD backplane 160 are low, at least one of the first SSD backplane 140, the second SSD backplane 150, and the third SSD backplane 160 may be powered off.

The cooling control board 170 may receive the power PWR from the power supply 110. The cooling control board 170 may control the coolers 180 under control of the baseboard 130. For example, the cooling control board 170 may control the coolers 180 under control of the first CPU 131, the second CPU 132, or the BMC 137 of the baseboard 130. The cooling control board 170 may control operation activation and deactivation of the coolers 180 and the intensity (e.g., fan speed RPM) of cooling.

The coolers 180 may receive the power PWR from the power supply 110. The coolers 180 may perform cooling under control of the cooling control board 170 such that a temperature of the electronic device 100 decreases. The coolers 180 may include fans, but embodiments are not limited thereto. The coolers 180 are not limited to the case where the coolers 180 are collectively disposed at one place. For example, the coolers 180 may be distributed and disposed at two or more places. A part of the coolers 180 may be attached to a chassis of the electronic device 100 and may inject an external air into the electronic device 100. The rest of the coolers 180 may be disposed at a specific component and may take full charge of cooling of the specific component.

The sensors (SENS) 190 may receive the power PWR from the power supply 110. The sensors 190 may be disposed adjacent to the components of the electronic device 100. The sensors 190 may collect a variety of information under control of the baseboard 130, and may provide the collected information to the baseboard 130.

For example, the sensors 190 may collect information under control of the BMC 137 of the baseboard 130, and may provide the collected information to the BMC 137. The sensors 190 may provide the collected information to the BMC 137 through sensor data repository (SDR) of the IPMI. For example, different record IDs may be assigned to the sensors 190. The sensors 190 may provide information to the BMC 137 based on different record IDs. The sensors 190 may include various sensors such as a temperature sensor, a humidity sensor, and a vibration sensor.

An example is illustrated in FIG. 1 as a specific number of CPUs and a specific number of memories are installed in the baseboard 130, but the number of CPUs and the number of memories are not limited thereto. A specific number of SSD backplanes are illustrated in FIG. 1, but the number of SSD backplanes is not limited thereto. Specific kinds of coolers are illustrated in FIG. 1 as much as a specific number, but kinds of coolers and the number of coolers are not limited thereto. A specific number of sensors are illustrated in FIG. 1, but kinds of sensors and the number of sensors are not limited thereto.

Figure 2:
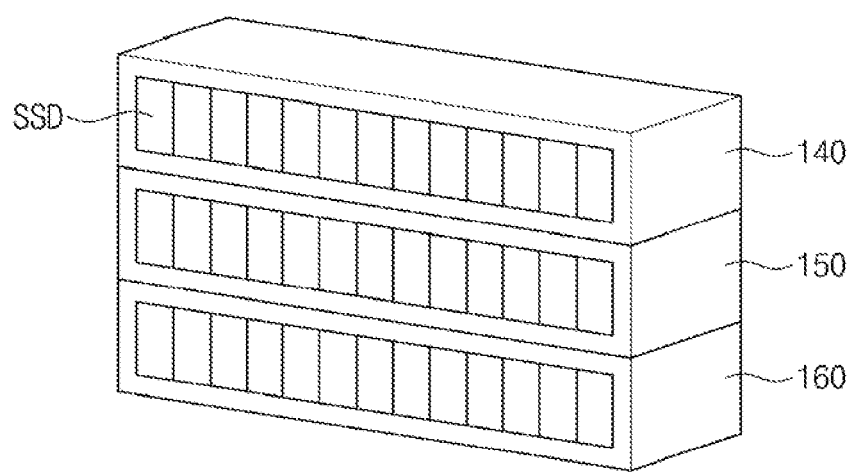
FIG. 2 illustrates an example in which SSDs are installed in a first SSD backplane, a second SSD backplane, and a third SSD backplane.

FIG. 2 illustrates an example in which SSDs are installed in the first SSD backplane 140, the second SSD backplane 150, and the third SSD backplane 160. Referring to FIGS. 1 and 2, to reduce the size of the electronic device 100, SSDs may be closely installed in each of the first SSD backplane 140, the second SSD backplane 150, and the third SSD backplane 160. Also, to reduce the size of the electronic device 100, the first SSD backplane 140, the second SSD backplane 150, and the third SSD backplane 160 may be in close contact with each other.

When one of the first SSD backplane 140, the second SSD backplane 150, and the third SSD backplane 160 is in a power-off state, the remaining SSD backplanes may be in a power-on state. A temperature of the SSD backplane being in the power-off state may increase due to heat generated at the SSD backplanes being in the power-on state. A temperature of the SSD backplane being in the power-off state may increase due to heat convected by the coolers 180.

When a temperature of the SSD backplane that is in the powered-off state increases, the increased temperature may accelerate a reduction of retention of the SSDs installed in the powered-off SSD backplane. The reduction of retention may be recovered by a retention recovery operation. However, the retention recovery operation is not performed when the SSD backplane is in the power-off state. Accordingly, due to the reduction of retention, a data loss may occur at the SSDs installed in the SSD backplane being in the power-off state. As such, the electronic device 100 according to an example embodiment may power on at least one of SSDs installed in an SSD backplane that is in a power-off state in response to an increase in a temperature of the powered-off SSD backplane. The powered-on SSD(s) may perform the retention recovery operation to recover the reduction of retention. Accordingly, data can be prevented from being lost due to the reduction of retention accelerated by a high temperature at an SSD backplane being in a power-off state.

Figure 3:
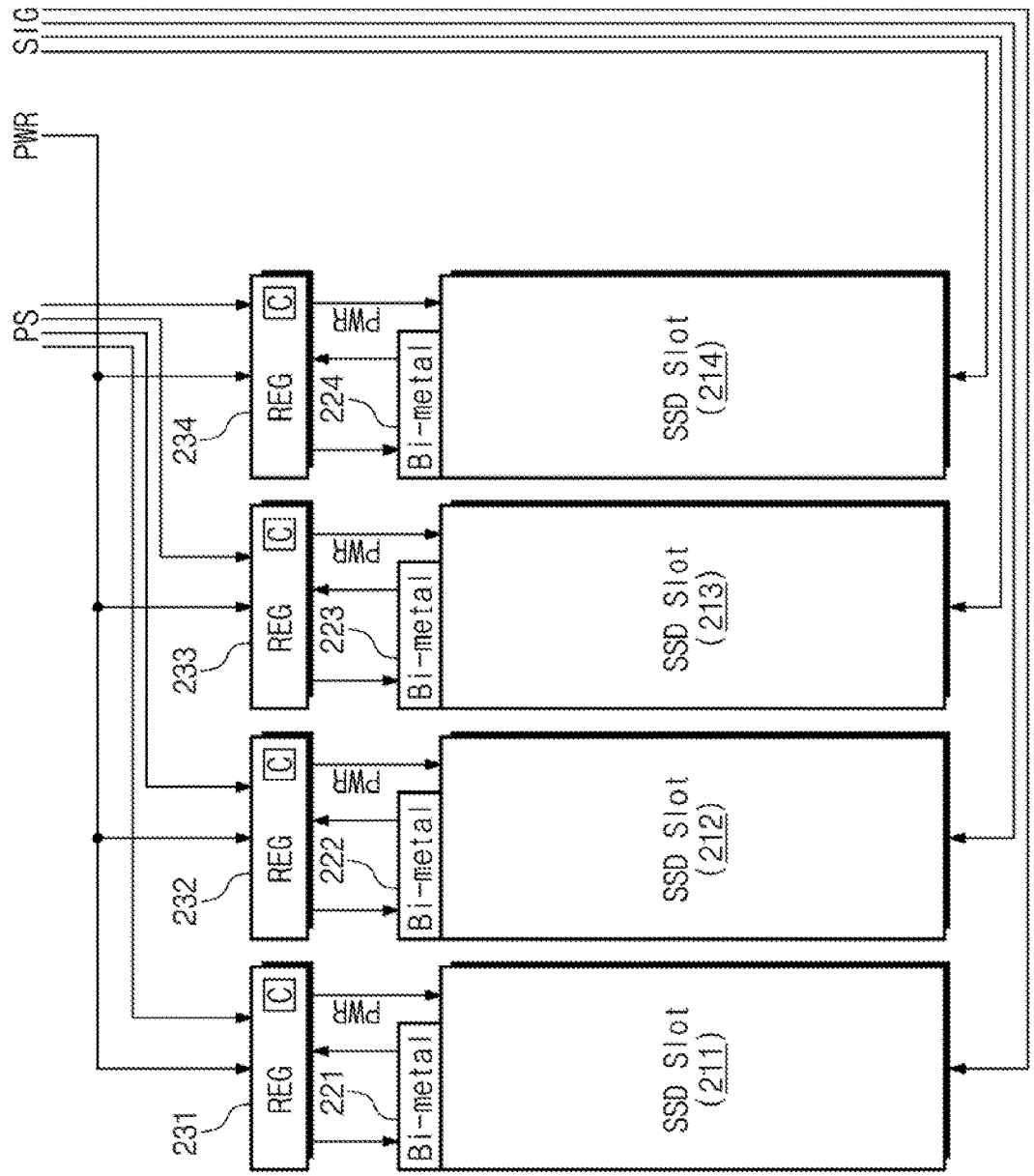
FIG. 3 illustrates an SSD backplane according to a first example embodiment.

FIG. 3 illustrates an SSD backplane 200 according to a first example embodiment.

The SSD backplane 200 may correspond to the first SSD backplane 140, the second SSD backplane 150, and the third SSD backplane 160 of FIG. 1. Referring to FIGS. 1 and 3, the SSD backplane 200 may include first through fourth SSD slots 211, 212, 213, and 214. However, the number of slots is not limited. A respective SSD may be installed in each of the first SSD slot 211, the second SSD slot 212, the third SSD slot 213, and the fourth SSD slot 214. The SSDs may exchange the signals SIG with the baseboard 130 through signal lines.

The SSD backplane 200 may include first through fourth bi-metals 221, 222, 223, and 224 respectively corresponding to the first through fourth SSD slots 211, 212, 213, and 214, and may include first through fourth regulators 231, 232, 233, and 234 respectively corresponding to the first through fourth SSD slots 211, 212, 213, and 214.

Each of the first bi-metal 221, the second bi-metal 222, the third bi-metal 223, and the fourth bi-metal 224 may include two separate materials (or metals) joined together and having different thermal expansion coefficients. In response to an increase of temperature, a material having a greater thermal expansion coefficient may expand more than a material having a smaller thermal expansion coefficient. Accordingly, each of the first bi-metal 221, the second bi-metal 222, the third bi-metal 223, and the fourth bi-metal 224 may be bent toward a material having a smaller thermal expansion coefficient upon heating. Conversely, in response to a decrease of temperature, a material having a greater thermal expansion coefficient may contract more than a material having a smaller thermal expansion coefficient. Accordingly, each of the first bi-metal 221, the second bi-metal 222, the third bi-metal 223, and the fourth bi-metal 224 may be bent toward a material having a greater thermal expansion coefficient upon cooling.

Each of the first bi-metal 221, the second bi-metal 222, the third bi-metal 223, and the fourth bi-metal 224 may be respectively disposed adjacent to the first SSD slot 211, the second SSD slot 212, the third SSD slot 213, and the fourth SSD slot 214, such that the first bi-metal 221, the second bi-metal 222, the third bi-metal 223, and the fourth bi-metal 224 may be bent in response to temperatures of the first SSD slot 211, the second SSD slot 212, the third SSD slot 213, and the fourth SSD slot 214.

The first bi-metal 221, the second bi-metal 222, the third bi-metal 223, and the fourth bi-metal 224 may respectively receive voltages from the first regulator 231, the second regulator 232, the third regulator 233, and the fourth regulator 234. In response to an increase of temperature, the first bi-metal 221, the second bi-metal 222, the third bi-metal 223, and the fourth bi-metal 224 may be bent so as to be connected to (or spaced or disconnected from (e.g., the contacts may be normally open or normally closed, and appropriate logic may be implemented in accordance therewith)) terminals of the first regulator 231, the second regulator 232, the third regulator 233, and the fourth regulator 234. Accordingly, the first bi-metal 221, the second bi-metal 222, the third bi-metal 223, and the fourth bi-metal 224 may return (or may not return) the voltages received from the first regulator 231, the second regulator 232, the third regulator 233, and the fourth regulator 234 to the first regulator 231, the second regulator 232, the third regulator 233, and the fourth regulator 234. Conversely, in response to a decrease of temperature, the first bi-metal 221, the second bi-metal 222, the third bi-metal 223, and the fourth bi-metal 224 may be bent so as to be spaced from (or attached to) the terminals of the first regulator 231, the second regulator 232, the third regulator 233, and the fourth regulator 234. Accordingly, the first bi-metal 221, the second bi-metal 222, the third bi-metal 223, and the fourth bi-metal 224 may not return (or may return) the voltages received from the first regulator 231, the second regulator 232, the third regulator 233, and the fourth regulator 234 to the first regulator 231, the second regulator 232, the third regulator 233, and the fourth regulator 234.

The SSD backplane 200 may be powered on or powered off in response to the power signals PS from the baseboard 130. When the SSD backplane 200 is powered on, the first regulator 231, the second regulator 232, the third regulator 233, and the fourth regulator 234 may supply a power to the SSDs of the first SSD slot 211, the second SSD slot 212, the third SSD slot 213, and the fourth SSD slot 214. When the SSD backplane 200 is powered off, the first regulator 231, the second regulator 232, the third regulator 233, and the fourth regulator 234 may block the power from being supplied to the SSDs of the first SSD slot 211, the second SSD slot 212, the third SSD slot 213, and the fourth SSD slot 214.

When the SSD backplane 200 is powered off, the first regulator 231, the second regulator 232, the third regulator 233, and the fourth regulator 234 may monitor whether voltages are transferred from the first bi-metal 221, the second bi-metal 222, the third bi-metal 223, and the fourth bi-metal 224. When the voltages are not transferred (or are transferred), the first regulator 231, the second regulator 232, the third regulator 233, and the fourth regulator 234 may maintain power interruption. When the voltages are transferred (or are not transferred), the first regulator 231, the second regulator 232, the third regulator 233, and the fourth regulator 234 may supply the power to the SSDs of the first SSD slot 211, the second SSD slot 212, the third SSD slot 213, and the fourth SSD slot 214.

Each of the first regulator 231, the second regulator 232, the third regulator 233, and the fourth regulator 234 may include a capacitor "C" that stores power. When an ambient temperature is sufficiently high that a voltage is transferred from one of the first bi-metal 221, the second bi-metal 222, the third bi-metal 223, and the fourth bi-metal 224 (or that a voltage is not transferred therefrom), the corresponding regulator may supply a power to the corresponding SSD. In the case where a voltage is not transferred (or is transferred) from one bi-metal as an ambient temperature decreases before the retention recovery operation of the corresponding SSD is completed, the corresponding regulator may block power from being supplied to the corresponding SSD. In this case, the corresponding SSD may complete the retention recovery operation by using a power stored in the capacitor "C". For example, the capacitor "C" may be connected with an output terminal of the corresponding regulator, from which the power PWR is output.

In an example embodiment, the first regulator 231, the second regulator 232, the third regulator 233, and the fourth regulator 234 may block or supply a power in response to a common power signal PS. In another implementation, the first regulator 231, the second regulator 232, the third regulator 233, and the fourth regulator 234 may independently block or supply a power in response to respectively different power signals PS.

The first regulator 231, the second regulator 232, the third regulator 233, and the fourth regulator 234 may be powered on or powered off in response to the power signals PS from the first CPU 131, the second CPU 132, or the BMC 137 of the baseboard 130. The first regulator 231, the second regulator 232, the third regulator 233, and the fourth regulator 234 may be integrated into one regulator.

In an example embodiment, the first regulator 231, the second regulator 232, the third regulator 233, and the fourth regulator 234 may be replaced with power switches that operate in response to the power signals PS and the voltages from the first bi-metal 221, the second bi-metal 222, the third bi-metal 223, and the fourth bi-metal 224.

Figure 4:
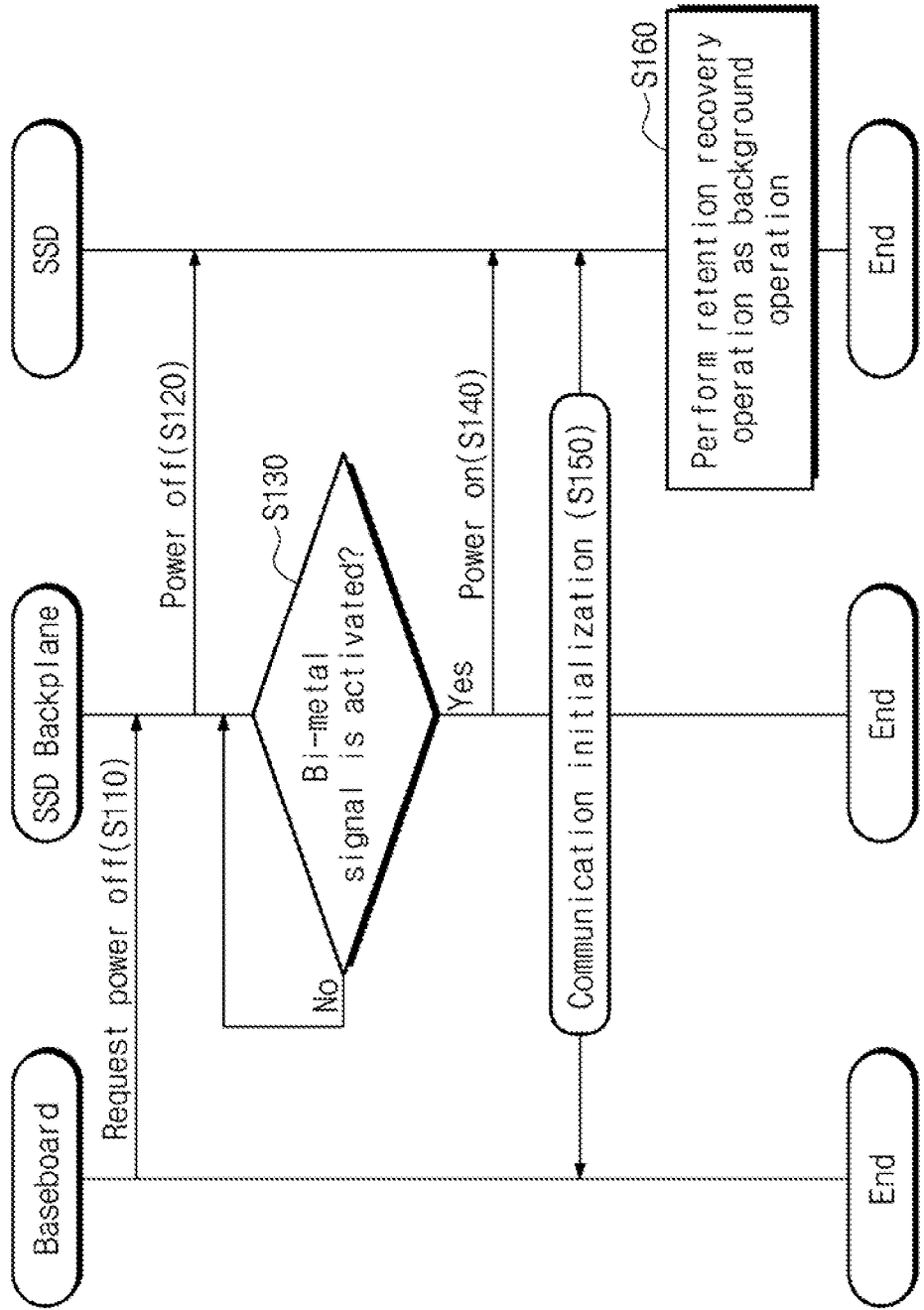
FIG. 4 illustrates a first example of an operating method of an electronic device according to an example embodiment.

FIG. 4 illustrates a first example of an operating method of the electronic device 100 according to an example embodiment. An operating method for an SSD installed in one SSD slot (e.g., the first SSD slot 211) is illustrated in FIG. 4.

Referring to FIGS. 1, 3, and 4, in operation S110, the baseboard 130 may request a power-off from an SSD backplane (e.g., 140) through the power signal PS. The power signal PS may be transferred based on one of various communication interfaces such as PCIe, NVMe, and IPMI.

In operation S120, the first SSD backplane 140 may block power from being supplied to the SSDs so as to be powered off. While the SSDs are powered off, in operation S130, a regulator (e.g., the first regulator 231) may supply a voltage to the first bi-metal 221 disposed adjacent to the first SSD slot 211, and may determine whether the voltage is transferred or is not transferred from the first bi-metal 221.

When a voltage is not transferred (or is transferred) from the first bi-metal 221 and thus a bi-metal signal is deactivated, the first regulator 231 may maintain power interruption. When a voltage is transferred (or is not transferred) from the first bi-metal 221 and thus the bi-metal signal is activated, operation S140 is performed. In operation S140, the first regulator 231 may supply a power to the SSD of the first SSD slot 211 so as to be powered on.

In operation S150, in response to that the SSDs are powered on, the SSDs may perform communication initialization with the baseboard 130. The communication initialization may be the following initialization for performing communication of the signals SIG between the baseboard 130 and the SSDs: timing adjustment, termination resistance adjustment, and signal intensity adjustment. Before or in parallel with the communication initialization, the SSDs may perform internal initialization. The internal initialization may be the following initialization for internal operations of the SSDs: loading firmware and setting internal voltage level.

In operation S160, the powered-on SSDs may perform the retention recovery operation as a background operation. For example, the retention recovery operation may include a detection operation of detecting retention-reduced data through a read operation, and a reclaim operation of again writing the retention-reduced data at any other location. The SSDs may schedule the retention recovery operation in compliance with an internally given algorithm, and may perform the retention recovery operation depending on the schedule.

The operations of FIG. 4 may be performed in parallel on respective SSDs belonging to an SSD backplane that is powered off. As a temperature decreases while the background operation is performed, a power may be blocked. In this case, each SSD may perform the retention recovery operation by using the power charged in the capacitor "C". In the case where a power is continuously supplied as a high temperature is maintained, the SSDs may perform the retention recovery operation based on the internally given algorithm two or more times.

In an example embodiment, each SSD may include a temperature sensor. Each SSD may schedule the retention recovery operation in compliance with the internally given algorithm based on the temperature sensed by the temperature sensor, and may perform the retention recovery operation depending on the schedule.

Figure 5:
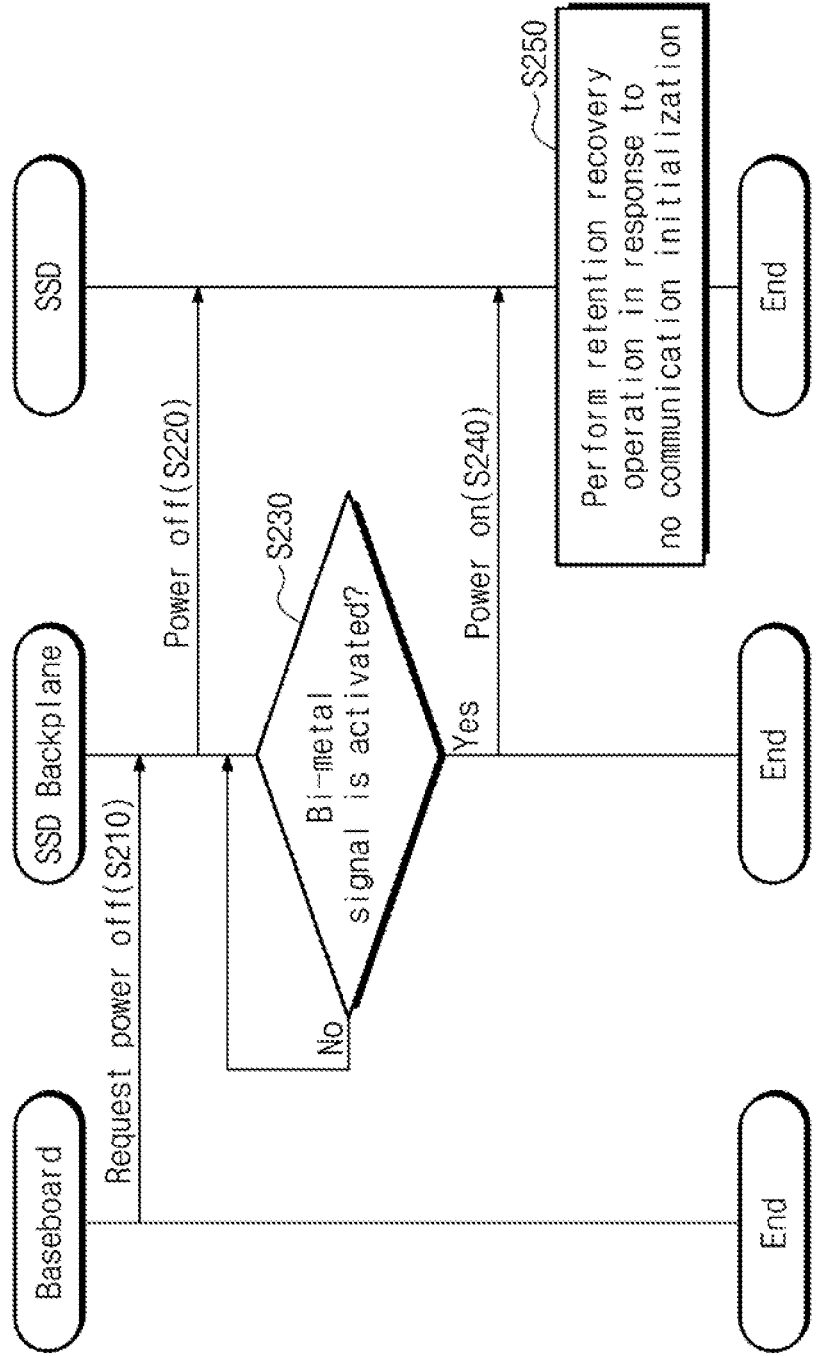
FIG. 5 illustrates a second example of an operating method of an electronic device according to an example embodiment.

FIG. 5 illustrates a second example of an operating method of the electronic device 100 according to an example embodiment.

Referring to FIGS. 1, 3, and 5, operation S210, operation S220, operation S230, and operation S240 are performed in the same scheme as operation S110, operation S120, operation S130, and operation S140 of FIG. 4. Thus, additional description will be omitted to avoid redundancy.

After a regulator (e.g., the first regulator 231) powers on SSDs installed in the first SSD slot 211, the baseboard 130 may not perform communication initialization with the SSDs. In an example embodiment, even though the communication initialization is requested by the SSDs (or an SSD backplane) powered off by the baseboard 130 or a procedure for communication initialization is performed, the baseboard 130 may ignore the request or procedure for communication initialization.

In operation S250, in response to no communication initialization, the SSDs may perform the retention recovery operation. The SSDs may identify temporary power-on due to an increase of temperature in response to no communication initialization. Immediately after being powered on, the SSDs may perform the retention recovery operation and may quickly detect the reduction of retention, thus quickly preventing a data loss due to the reduction of retention.

In another example embodiment, even though the communication initialization is not performed, each SSD may schedule the retention recovery operation as a background operation in compliance with the internally given algorithm, and may perform the scheduled retention recovery operation.

Figure 6:
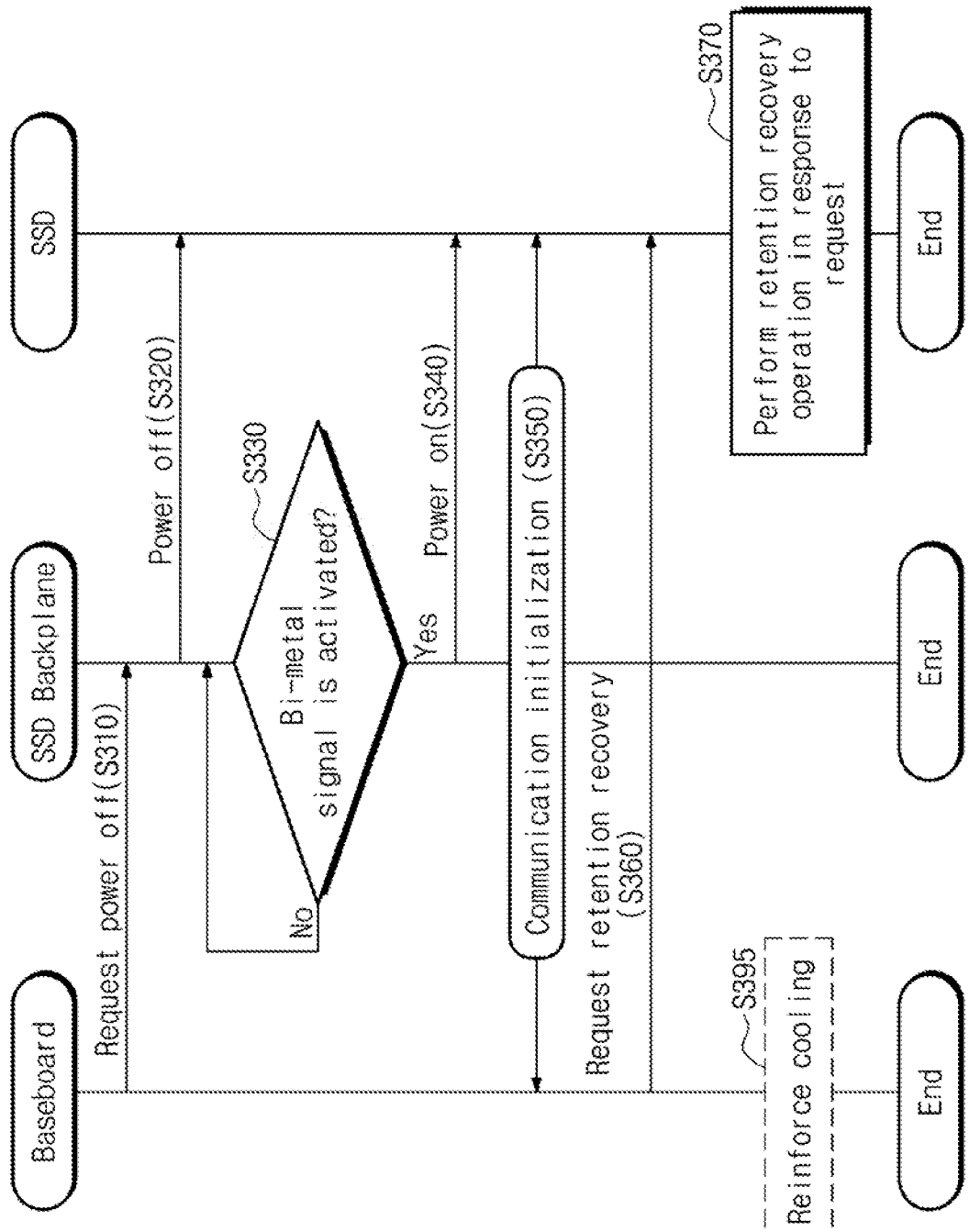
FIG. 6 illustrates a third example of an operating method of an electronic device according to an example embodiment.

FIG. 6 illustrates a third example of an operating method of the electronic device 100 according to an example embodiment.

Referring to FIGS. 1, 3, and 6, operation S310, operation S320, operation S330, operation S340, and operation S350 are performed in the same scheme as operation S110, operation S120, operation S130, operation S140, and operation S150 of FIG. 4. Thus, additional description will be omitted to avoid redundancy.

In response to the communication initialization in operation S350, the first CPU 131, the second CPU 132, or the BMC 137 of the baseboard 130 may recognize that SSDs installed in an SSD slot (e.g., the first SSD slot 211) are powered on. In response to that the SSDs of the powered-off SSD backplane (e.g., the first SSD backplane 140) are powered on, the baseboard 130 may recognize that the SSDs are powered on due to an increase of temperature.

In operation S360, the baseboard 130 may request the retention recovery operation from the powered-on SSDs. The baseboard 130 may request the retention recovery operation from the powered-on SSDs through the signals SIG. In operation S370, the powered-on SSDs may perform the retention recovery operation in response to the request from the baseboard 130.

In the above description, the baseboard 130 recognizes an increase of temperature through the communication initialization (operation S350). However, a means by which the baseboard 130 recognizes an increase of temperature is not limited. For example, in response to that the bi-metal signal is activated (operation S330), a regulator (e.g., the first regulator 231) may notify an increase of temperature of the baseboard 130 through a separate signal line. The separate signal line may be based on one of various communication interfaces such as PCIe, NVMe, and IPMI.

When the baseboard 130 transfers a request for retention recovery in operation S360, the baseboard 130 may transfer additional information to the powered-on SSDs. For example, the baseboard 130 may provide the powered-on SSDs with environment information, such as temperature information, and additional information influencing the retention of the powered-on SSDs. The powered-on SSDs may perform the retention recovery operation based on the information from the baseboard 130.

In an example embodiment, as an increase of temperature is recognized, in operation S395, the baseboard 130 may allow the cooling control board 170 to reinforce cooling of the coolers 180. In an example embodiment, a reference temperature for reinforcing cooling may be different from a reference temperature for powering on SSDs. The reference temperature for cooling and the reference temperature for power-on may be differently implemented by providing a bi-metal corresponding to the reference temperature for cooling and a bi-metal corresponding to the reference temperature for power-on separately. The reference temperature for cooling may be lower or higher than the reference temperature for power-on.

Figure 7:
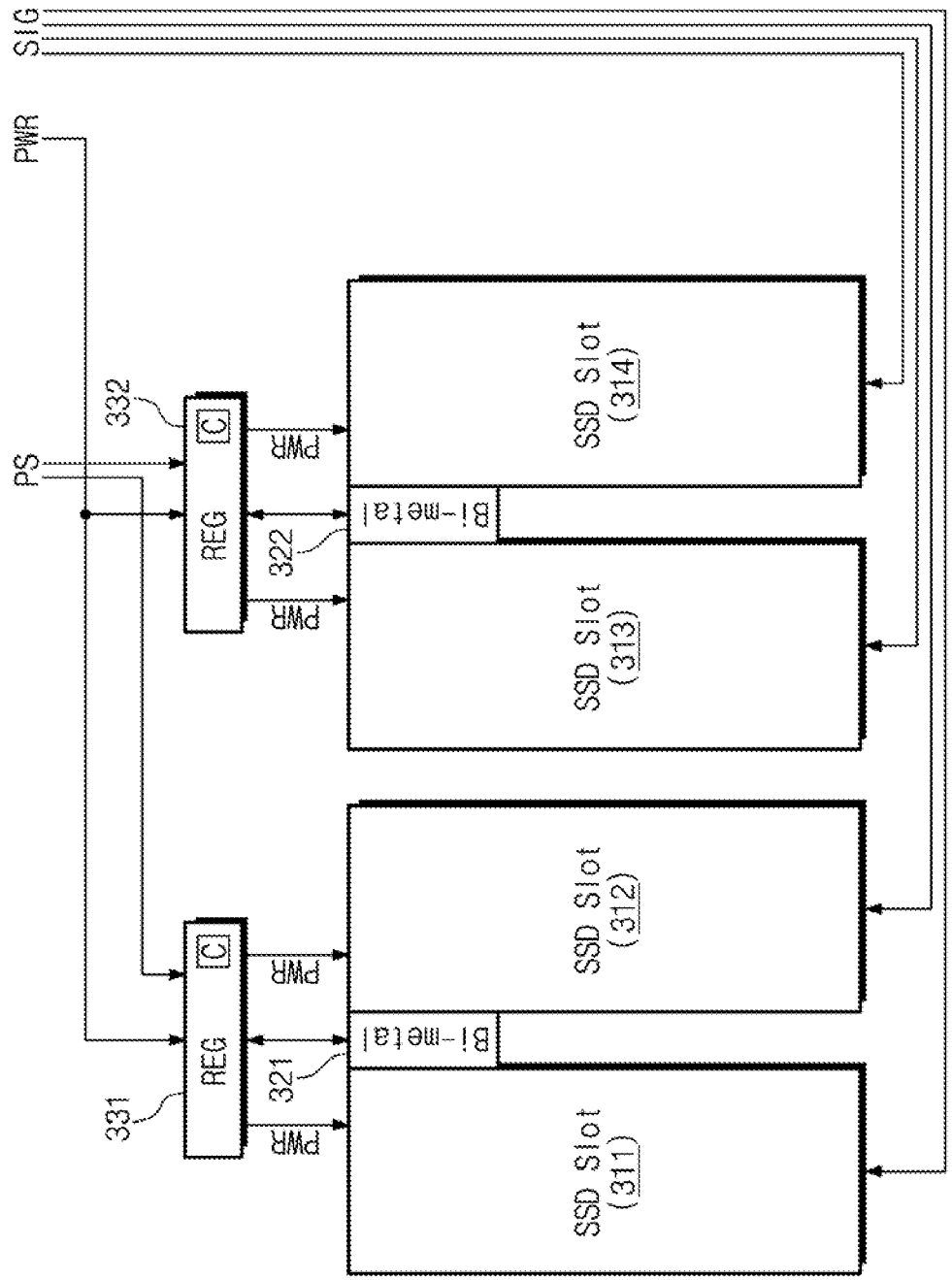
FIG. 7 illustrates an SSD backplane according to a second example embodiment.

FIG. 7 illustrates an SSD backplane 300 according to a second example embodiment.

The SSD backplane 300 may correspond to the first SSD backplane 140, the second SSD backplane 150, and the third SSD backplane 160 of FIG. 1. Referring to FIGS. 1 and 7, the SSD backplane 300 may include first through fourth SSD slots 311, 312, 313, and 314. SSDs installed in the first through fourth SSD slots 311, 312, 313, and 314 may exchange the signals SIG with the baseboard 130 through signal lines.

Compared to FIG. 3, one bi-metal 321 or 322 may be disposed adjacent to two SSD slots 311 and 312 or 313 and 314. Also, one regulator 331 or 332 may supply the power PWR to two SSD slots 311 and 312 or 313 and 314, may supply a voltage to one bi-metal 321 or 322, and may determine whether a voltage is received from one bi-metal 321 or 322.

Thus, when a temperature increases in a state where the SSD backplane 300 is in a power-off state, two or more SSDs may be powered on together. Each of the powered-on SSDs may perform the retention recovery operation. Afterwards, when a temperature again decreases, the two or more SSDs may be powered off together. When the retention recovery operation of at least one of the two or more SSDs is not completed, the at least one SSD may continue the retention recovery operation by using a power stored in the capacitor "C".

Figure 8:
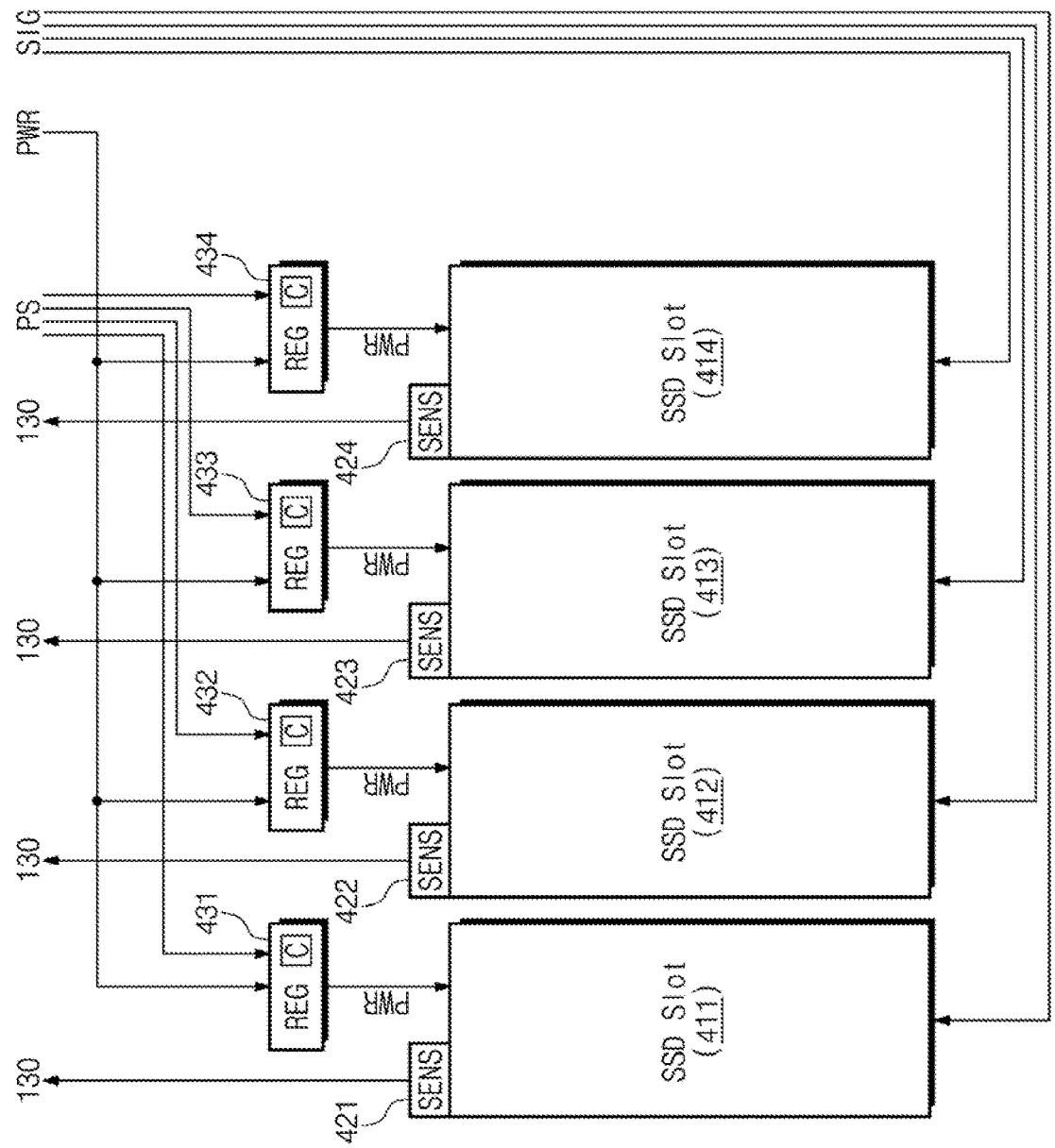
FIG. 8 illustrates an SSD backplane according to a third example embodiment.

FIG. 8 illustrates an SSD backplane 400 according to a third example embodiment. The SSD backplane 400 may correspond to the first SSD backplane 140, the second SSD backplane 150, and the third SSD backplane 160 of FIG. 1.

Referring to FIGS. 1 and 8, the SSD backplane 400 may include first through fourth SSD slots 411, 412, 413, and 414. However, the number of slots is not limited. SSDs may be installed in each of the first SSD slot 411, the second SSD slot 412, the third SSD slot 413, and the fourth SSD slot 414. The SSDs may exchange the signals SIG with the baseboard 130 through signal lines.

The SSD backplane 400 may include first through fourth sensors 421, 422, 423, and 424 respectively corresponding to the first through fourth SSD slots 411, 412, 413, and 414, and may include first through fourth regulators 431, 432, 433, and 434 respectively corresponding to the first through fourth SSD slots 411, 412, 413, and 414. The first sensor 421, the second sensor 422, the third sensor 423, and the fourth sensor 424 may be temperature sensors. Each of the first sensor 421, the second sensor 422, the third sensor 423, and the fourth sensor 424 may periodically sense an ambient temperature, and may transfer information about the sensed temperature to the baseboard 130.

For example, each of the first sensor 421, the second sensor 422, the third sensor 423, and the fourth sensor 424 may transfer temperature information to the BMC 137 of the baseboard 130 based on the communication interface of the IPMI. The temperature information may be transferred to the BMC 137 through a sensor data repository (SDR) field of a message of the IPMI. In an example embodiment, the first sensor 421, the second sensor 422, the third sensor 423, and the fourth sensor 424 may be sensors disposed at the SSD backplane 400 from among the sensors 190 of FIG. 1.

The SSD backplane 400 may be powered on or powered off in response to the power signals PS from the baseboard 130. When the SSD backplane 400 is powered on, the first regulator 431, the second regulator 432, the third regulator 433, and the fourth regulator 434 may supply a power to the SSDs of the first SSD slot 411, the second SSD slot 412, the third SSD slot 413, and the fourth SSD slot 414. When the SSD backplane 400 is powered off, the first regulator 431, the second regulator 432, the third regulator 433, and the fourth regulator 434 may block the power from being supplied to the SSDs of the first SSD slot 411, the second SSD slot 412, the third SSD slot 413, and the fourth SSD slot 414.

The BMC 137 may monitor whether temperatures of the SSDs are greater than a critical value, based on the temperature information transferred from the first sensor 421, the second sensor 422, the third sensor 423, and the fourth sensor 424. When the temperatures of the SSDs are equal to smaller than the critical value, the SSDs of the powered-off SSD backplane 400 may maintain a power-off state. When a temperature of a specific SSD is greater than the critical value, the first CPU 131, the second CPU 132, or the BMC 137 of the baseboard 130 may control the corresponding regulator through the corresponding one of the power signals PS such that a power is supplied to the specific SSD.

Each of the first regulator 431, the second regulator 432, the third regulator 433, and the fourth regulator 434 may include the capacitor "C" to store power. When an ambient temperature is higher than the critical value, the corresponding regulator may supply a power to the corresponding SSD. In the case where an ambient temperature decreases before the retention recovery operation of the corresponding SSD is completed, the corresponding regulator may block power from being supplied to the corresponding SSD. In this case, the corresponding SSD may complete the retention recovery operation by using a power stored in the capacitor "C". Thus, the capacitor "C" may be connected with an output terminal of the corresponding regulator, from which the power PWR is output.

In an example embodiment, the first regulator 431, the second regulator 432, the third regulator 433, and the fourth regulator 434 may be replaced with power switches operating in response to the power signals PS.

Figure 9:
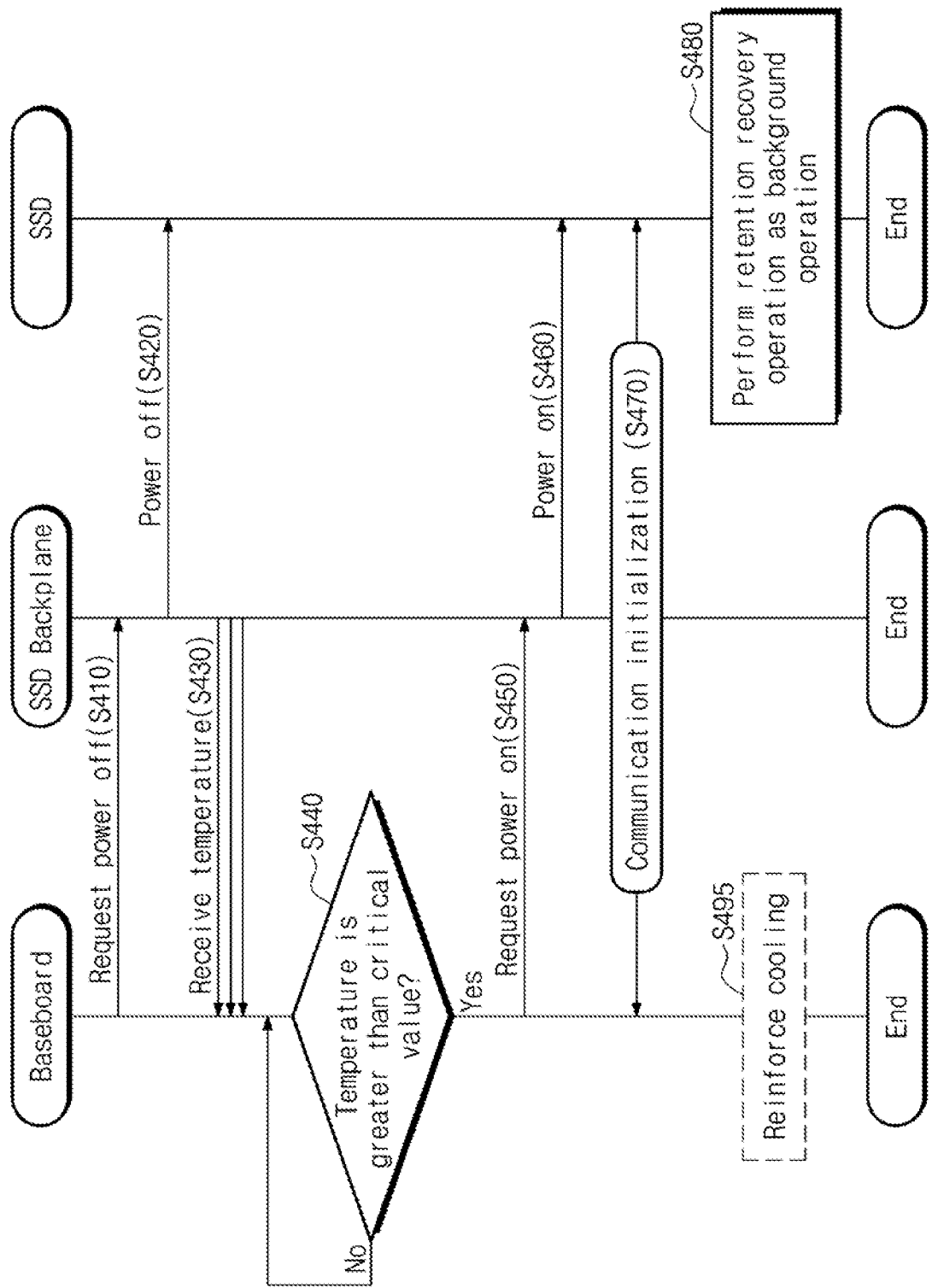
FIG. 9 illustrates a fourth example of an operating method of an electronic device according to an example embodiment.

FIG. 9 illustrates a fourth example of an operating method of the electronic device 100 according to an example embodiment. In an example embodiment, an operating method for an SSD installed in one SSD slot (e.g., the first SSD slot 411) is illustrated in FIG. 9.

Referring to FIGS. 1, 8, and 9, in operation S410, the baseboard 130 may request a power-off from an SSD backplane (e.g., the first SSD backplane 140) through the power signal PS. The power signal PS may be transferred based on one of various communication interfaces such as PCIe, NVMe, and IPMI.

In operation S420, the first SSD backplane 140 may block power from being supplied to the SSDs so as to be powered off. While the SSDs are powered off, in operation S430, a sensor (e.g., the first sensor 421) installed in the SSD backplane 400 may periodically transfer temperature information to the BMC 137 of the baseboard 130. The BMC 137 may receive the temperature information, and may log the received temperature information.

In operation S440, the first CPU 131, the second CPU 132, or the BMC 137 of the baseboard 130 may determine whether a temperature of an SSD is greater than the critical value. When the temperature of the SSD is not greater than the critical value, the baseboard 130 may not perform a separate control on the SSD backplane 400.

When the temperature of the SSD is greater than the critical value, in operation S450, the baseboard 130 may request a power-on of the SSD from the SSD backplane 400. The power-on request may be transferred by using the power signal PS. In operation S460, the first regulator 431 may supply a power to the SSDs of the first SSD slot 411 so as to be powered on.

In operation S470, in response to the SSDs being powered on, the SSDs may perform communication initialization with the baseboard 130. Before, after, or in parallel with the communication initialization, the SSDs may perform internal initialization.

In operation S480, the powered-on SSDs may perform the retention recovery operation as a background operation. For example, the retention recovery operation may include a detection operation of detecting retention-reduced data through a read operation, and a reclaim operation of again writing the retention-reduced data at any other location. The SSDs may schedule the retention recovery operation based on an internally given algorithm, and may perform the retention recovery operation depending on the schedule.

The operations of FIG. 9 may be performed in parallel on respective SSDs belonging to an SSD backplane being powered off. As a temperature decreases while the background operation is performed, a power may be blocked. In this case, each SSD may perform the retention recovery operation by using the power charged in the capacitor "C". In the case where a power is continuously supplied as a high temperature is maintained, the SSDs may perform the retention recovery operation based on the internally given algorithm two or more times.

In an example embodiment, each SSD may include a temperature sensor. Each SSD may schedule the retention recovery operation in compliance with the internally given algorithm based on the temperature sensed by the temperature sensor, and may perform the retention recovery operation depending on the schedule.

In an example embodiment, as an increase of temperature is recognized, in operation S495, the baseboard 130 may allow the cooling control board 170 to reinforce cooling of the coolers 180. In an example embodiment, a reference temperature for reinforcing cooling may be different from a reference temperature for powering on SSDs. The baseboard 130 may compare a temperature of an SSD with two different critical values such that the reference temperature for cooling and the reference temperature for power-on are differently implemented. The reference temperature for cooling may be lower or higher than the reference temperature for power-on.

Figure 10:
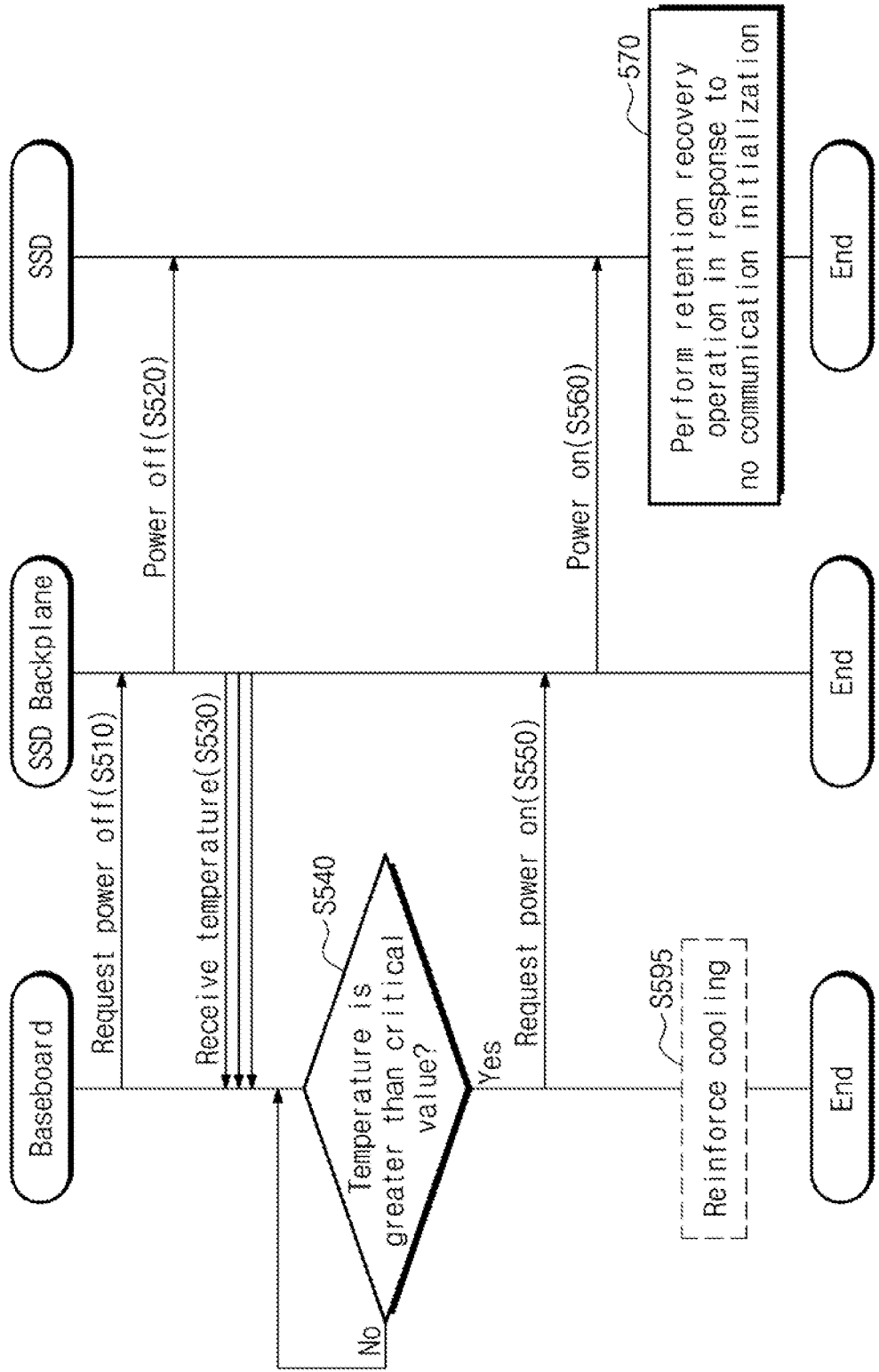
FIG. 10 illustrates a fifth example of an operating method of an electronic device according to an example embodiment.

FIG. 10 illustrates a fifth example of an operating method of the electronic device 100 according to an example embodiment. Referring to FIGS. 1, 8, and 10, operation S510, operation S520, operation S530, operation S540, operation S550, operation S560, and operation S595 are performed to be identical to operation S410, operation S420, operation S430, operation S440, operation S450, operation S460, and operation S495 of FIG. 9. Thus, additional description will be omitted to avoid redundancy.

After a regulator (e.g., the first regulator 431) powers off SSDs installed in the first SSD slot 411, the baseboard 130 may not perform communication initialization with the SSDs. In an example embodiment, even though the communication initialization is requested by the SSDs powered off due to an increase of temperature or when a procedure for communication initialization is performed, the baseboard 130 may ignore the request or procedure for communication initialization.

In operation S570, in response to no communication initialization, the SSDs may perform the retention recovery operation. The SSDs may identify temporary power-on due to an increase of temperature in response to no communication initialization. Immediately after being powered on, the SSDs may perform the retention recovery operation and may quickly detect the reduction of retention, thus quickly preventing a data loss due to the reduction of retention.

In another example embodiment, even though the communication initialization is not performed, each SSD may schedule the retention recovery operation as a background operation in compliance with the internally given algorithm, and may perform the scheduled retention recovery operation.

Figure 11:
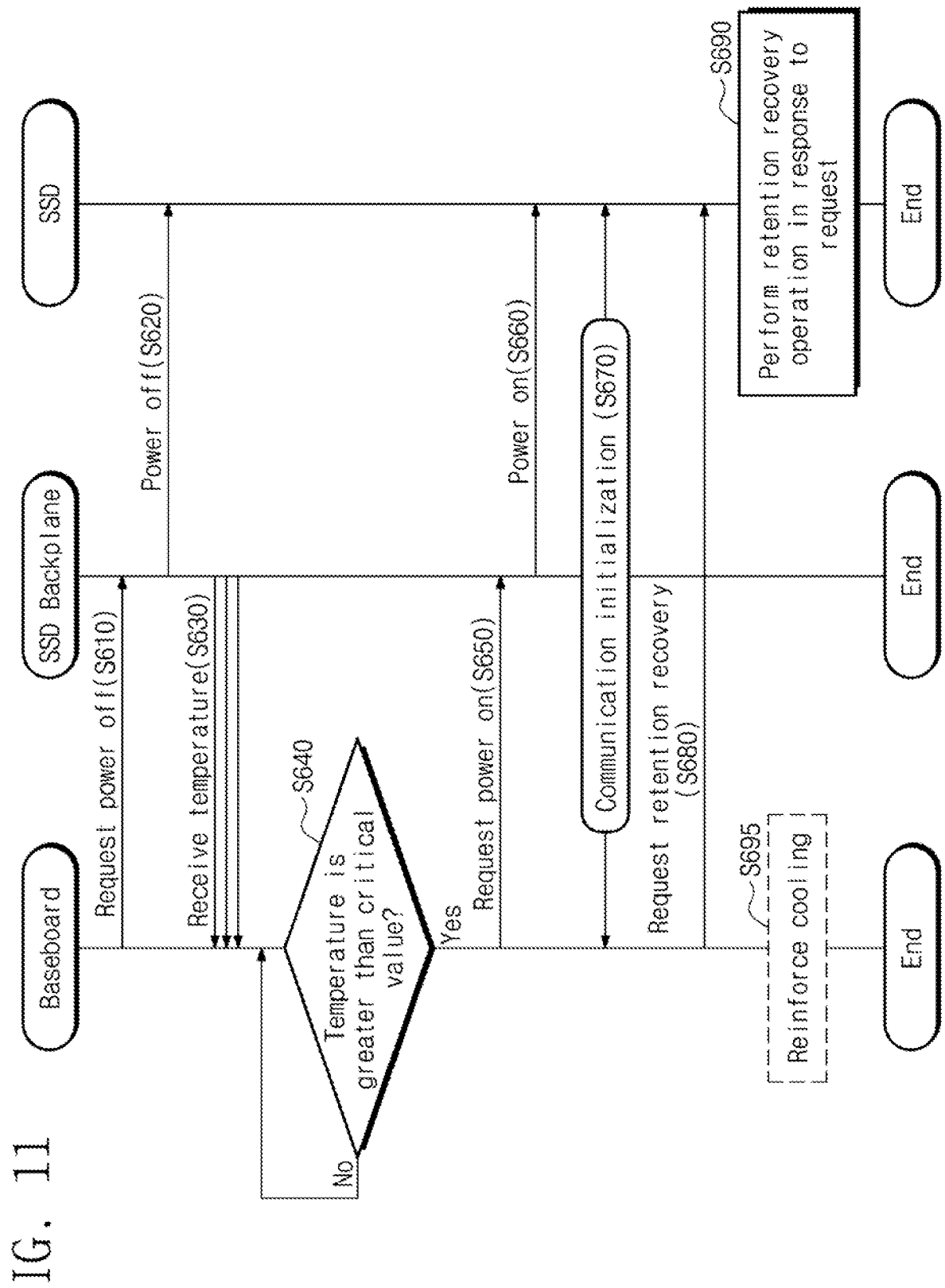
FIG. 11 illustrates a sixth example of an operating method of an electronic device according to an example embodiment.

FIG. 11 illustrates a sixth example of an operating method of the electronic device 100 according to an example embodiment. Referring to FIGS. 1, 8, and 11, operation S610, operation S620, operation S630, operation S640, operation S650, operation S660, operation S670, and operation S695 are performed to be identical to operation S410, operation S420, operation S430, operation S440, operation S450, operation S460, operation S470, and operation S495 of FIG. 9. Thus, additional description will be omitted to avoid redundancy.

In operation S680, the baseboard 130 may request the retention recovery operation from the powered-on SSDs. The baseboard 130 may request the retention recovery operation from the powered-on SSDs through the signals SIG. In operation S690, the powered-on SSDs may perform the retention recovery operation in response to the request from the baseboard 130.

When the baseboard 130 transfers a request for retention recovery in operation S680, the baseboard 130 may transfer additional information to the powered-on SSDs. For example, the baseboard 130 may provide the powered-on SSDs with environment information, such as temperature information, and additional information influencing the retention of the powered-on SSDs. The powered-on SSDs may perform the retention recovery operation based on the information from the baseboard 130.

Figure 12:
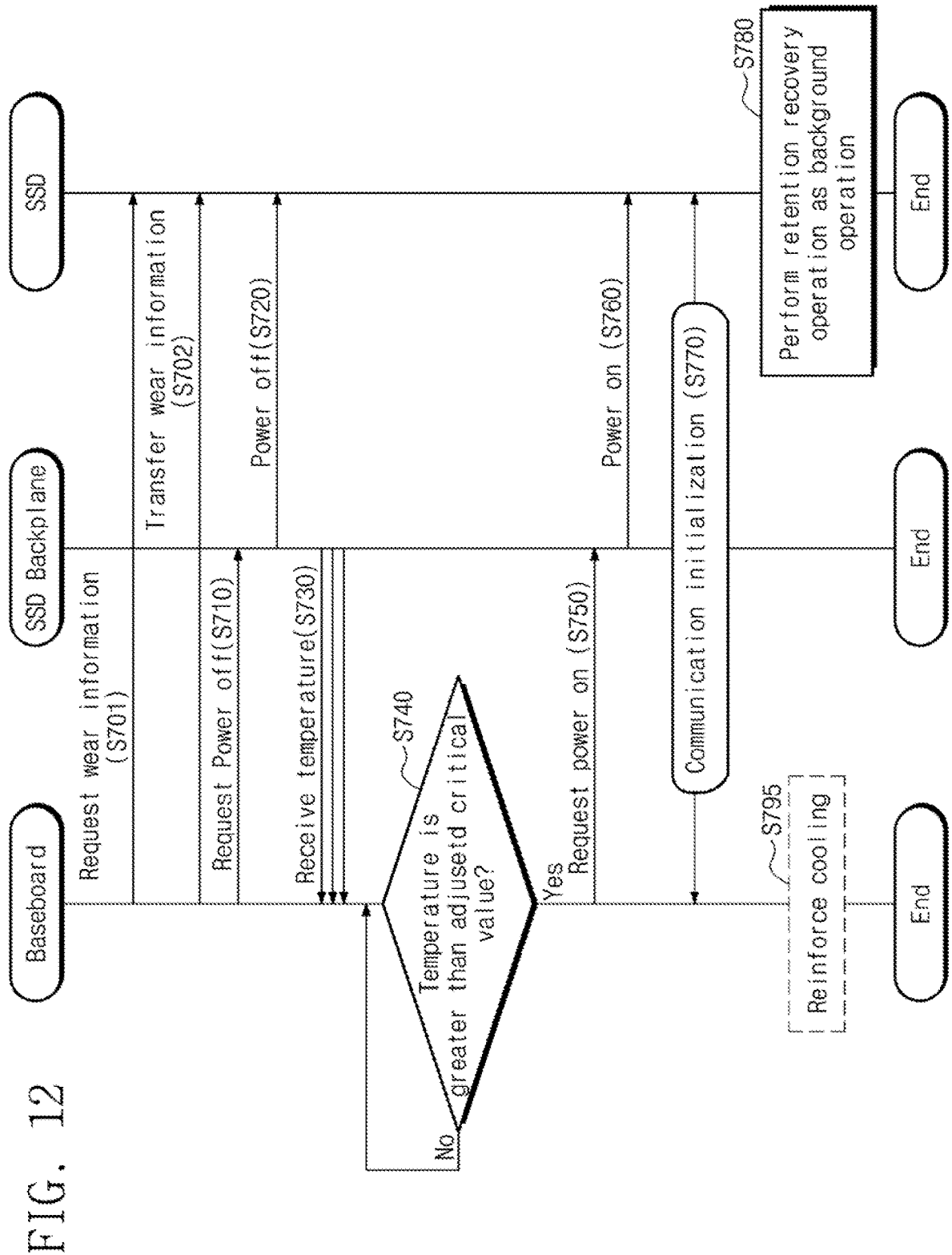
FIG. 12 illustrates a seventh example of an operating method of an electronic device according to an example embodiment.

FIG. 12 illustrates a seventh example of an operating method of the electronic device 100 according to an example embodiment. Referring to FIGS. 1, 8, and 12, operation S710, operation S720, operation S730, operation S750, operation S760, operation S770, operation S780, and operation S795 are performed to be identical to operation S410, operation S420, operation S430, operation S450, operation S460, operation S470, operation S480, and operation S495 of FIG. 9. Thus, additional description will be omitted to avoid redundancy.

Before powering off the SSD backplane 400, in operation S701, the first CPU 131, the second CPU 132, or the BMC 137 of the baseboard 130 may request wear information from an SSD. In operation S702, the SSD may transfer the wear information to the baseboard 130. Afterwards, the baseboard 130 may perform a power-off in operation S710.

The wear information may be information indicating that the SSD is worn due to operations such as a program operation and an erase operation. As the wear progresses, a retention characteristic of the SSD may decrease. Before powering off the SSD, the baseboard 130 may collect wear information of the SSD and may adjust a critical value based on the wear information. Afterwards, when it is determined in operation S740 that a temperature is greater than the adjusted critical value, the baseboard 130 may request a power-on of the SSD (operation S750).

In an example embodiment, the wear information may include SMART (Self-Monitoring Analysis and Reporting Technology) information of the SSD. The wear information may be collected based on the IPMI. In detail, the wear information may be collected by using an SDR field of a message of the IPMI.

In an example embodiment, a configuration to collect wear information in operation S701 and operation S702 and a configuration to use an adjusted critical value in operation S740 may also be applied to the embodiments of FIGS. 10 and 11.

FIG. 13 illustrates an example of program/erase (PE) cycles and adjusted critical values as an example of wear information. Referring to FIGS. 1 and 13, the critical value may be 80 when the number of PE cycles are equal to or less than 0.1K, may be 70 when the number of PE cycles exceeds 0.1K and is equal to or less than 1K, may be 60 when the number of PE cycles exceeds 1K and is equal to or less than 3K, may be 50 when the number of PE cycles exceeds 3K and is equal to or less than 5K, may be 40 when the number of PE cycles exceeds 5K and is equal to or less than 7K, and may be 30 when the number of PE cycles exceeds 7K and is equal to or less than 10K. As the number of PE cycles increases, a wear level of an SSD may increase, and a critical value may decrease.

The baseboard 130 according to an example embodiment may further compare a temperature with a cautious value, which is smaller than the critical value. The cautious value may be 70 when the number of PE cycles are equal to or less than 0.1K, may be 60 when the number of PE cycles exceeds 0.1K and is equal to or less than 1K, may be 50 when the number of PE cycles exceeds 1K and is equal to or less than 3K, may be 40 when the number of PE cycles exceeds 3K and is equal to or less than 5K, may be 30 when the number of PE cycles exceeds 5K and is equal to or less than 7K, and may be 20 when the number of PE cycles exceeds 7K and is equal to or less than 10K.

In an example embodiment, when a temperature of an SSD is equal to or less than a critical value, and an amount of time when the temperature of the SSD is greater than the cautious value exceeds a given time period, the baseboard 130 may power on the SSD to instruct the retention recovery operation of the SSD (or to request the retention recovery operation from the SSD). Accordingly, there may be detected the reduction of retention of an SSD occurring when a temperature of the SSD is equal to or less than the critical value but the SSD is left alone at a temperature close to the critical value for a long time, and a data loss due to the reduction of retention may be prevented.

Figure 14:
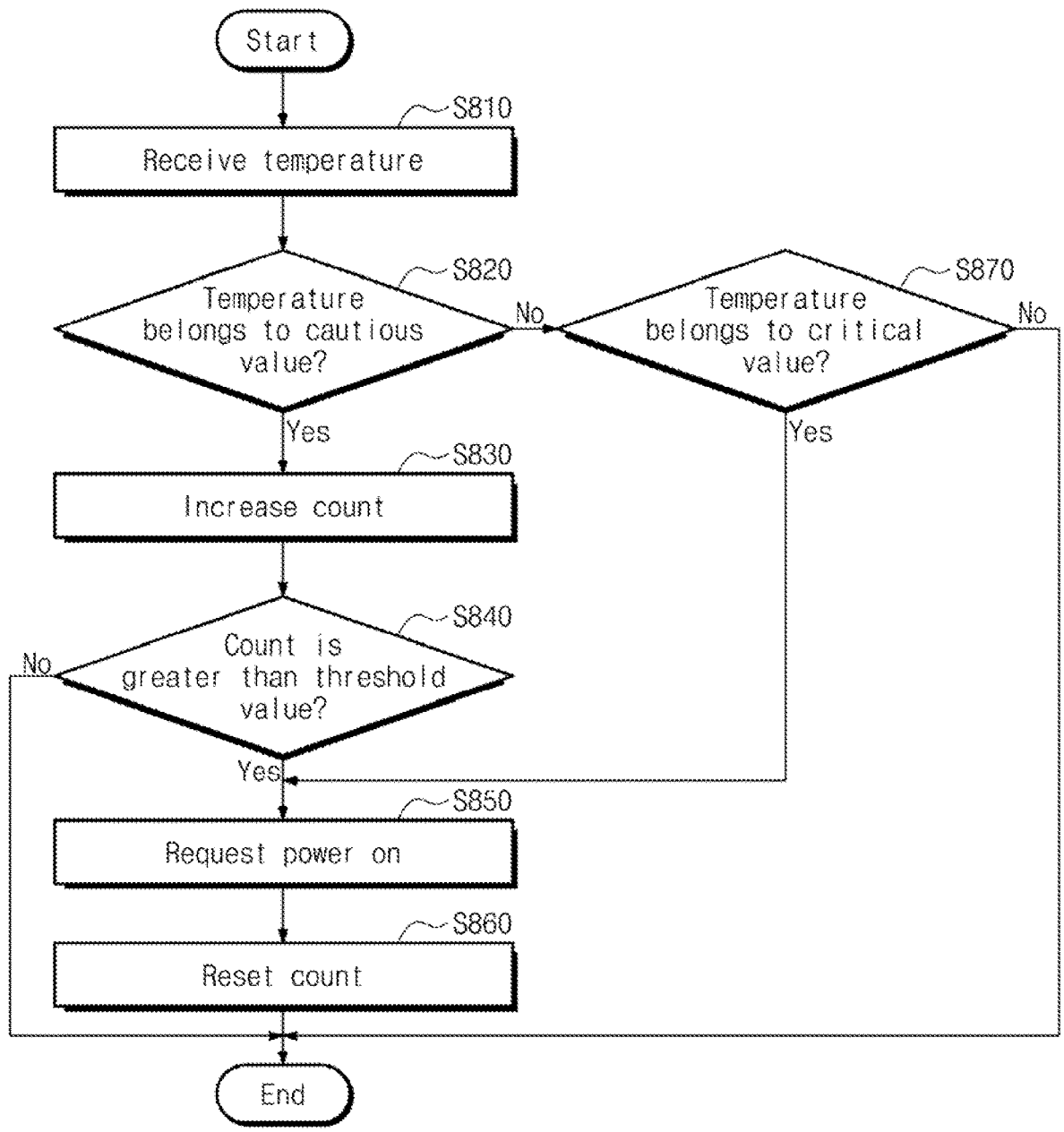
FIG. 14 illustrates an eighth example of an operating method of an electronic device according to an example embodiment.

FIG. 14 illustrates an eighth example of an operating method of the electronic device 100 according to an example embodiment.

Referring to FIGS. 1, 8, and 14, in operation S810, the baseboard 130 may receive temperature information from the first sensor 421 adjacent to one SSD slot (e.g., the first SSD slot 411) of the SSD backplane 400.

In operation S820, the baseboard 130 may determine whether a temperature of an SSD belongs to a range of the cautious value. For example, the baseboard 130 may determine whether the temperature of the SSD is equal to or less than the critical value and is greater than the cautious value. When the temperature of the SSD belongs to the range of the cautious value, in operation S830, the baseboard 130 may increase a count of the SSD.

In operation S840, the baseboard 130 may determine whether the count of the SSD is greater than a threshold value. When the count of the SSD is not greater than the threshold value, the baseboard 130 may not perform a separate control on the SSD. When the count of the SSD is greater than the threshold value, in operation S850, the baseboard 130 may request a power-on of the SSD. In operation S860, the baseboard 130 may reset the count of the SSD.

Operation S850 may correspond to operation S450 of FIG. 9, operation S550 of FIG. 10, operation S650 of FIG.

11, and operation S750 of FIG. 12. Operations following operation S450 of FIG. 9, operations following operation S550 of FIG. 10, operations following operation S650 of FIG. 11, or operations following operation S750 of FIG. 12 may be performed next to operation S850.

When it is determined in operation S820 that the temperature of the SSD does not belong to the range of the cautious value, in operation S870, the baseboard 130 may determine whether the temperature of the SSD belongs to a range of the critical value. For example, the baseboard 130 may determine whether the temperature of the SSD is greater than the critical value. When the temperature is greater than the critical value, operation S850 may be performed.

When the temperature is not greater than the critical value, the baseboard 130 may not perform a separate control on the SSD. When the temperature is greater than the critical value, in operation S850, the baseboard 130 may request a power-on of the SSD. In operation S860, the baseboard 130 may reset the count of the SSD.

The operations of FIG. 14 may be performed whenever temperature information is received from a sensor (e.g., the first sensor 421) corresponding to one SSD slot (e.g., the first SSD slot 411) of the SSD backplane 400. In another implementation, the first sensor 421 may transfer temperature information to the baseboard 130 based on a first period. The baseboard 130 may perform the operations of FIG. 14 by using a lately transferred temperature, based on a second period. The second period may be longer than the first period.

Figure 15:
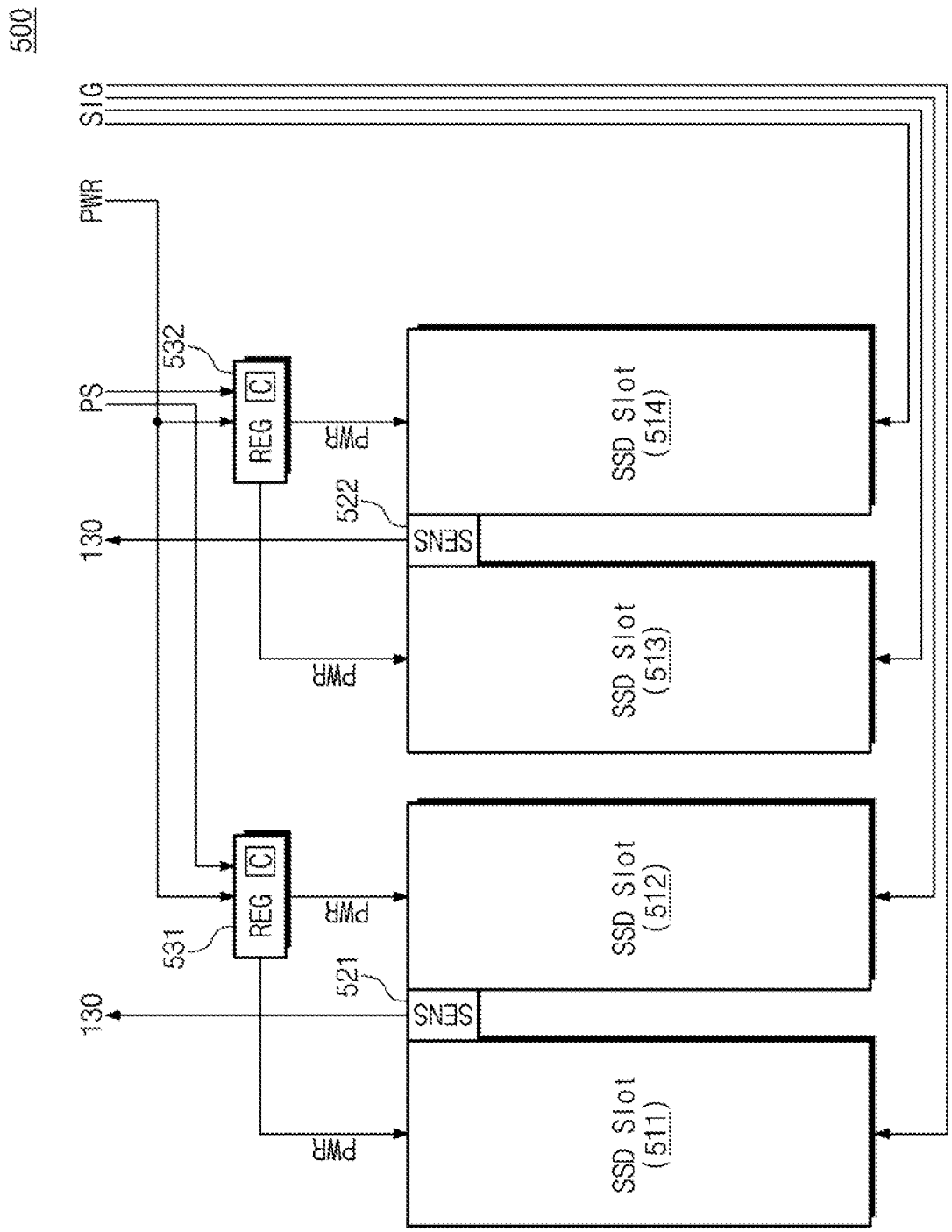
FIG. 15 illustrates an SSD backplane according to a fourth example embodiment.

FIG. 15 illustrates an SSD backplane 500 according to a fourth example embodiment. The SSD backplane 500 may correspond to the first SSD backplane 140, the second SSD backplane 150, and the third SSD backplane 160 of FIG. 1.

Referring to FIGS. 1 and 15, the SSD backplane 500 may include first through fourth SSD slots 511, 512, 513, and 514. SSDs installed in the first through fourth SSD slots 511, 512, 513, and 514 may exchange the signals SIG with the baseboard 130 through signal lines.

Compared to FIG. 8, one sensor 521 or 522 may be disposed adjacent to two SSD slots 511 and 512 or 513 and 514. Also, one regulator 531 or 532 may supply the power PWR to two SSD slots 511 and 512 or 513 and 514.

Thus, when a temperature increases in a state where the SSD backplane 500 is in a power-off state, two or more SSDs may be powered on together. Each of the powered-on SSDs may perform the retention recovery operation. Afterwards, when a temperature again decreases, the two or more SSDs may be powered off together. When the retention recovery operation of at least one of the two or more SSDs is not completed, the at least one SSD may continue the retention recovery operation by using a power stored in the capacitor "C".

Figure 16:
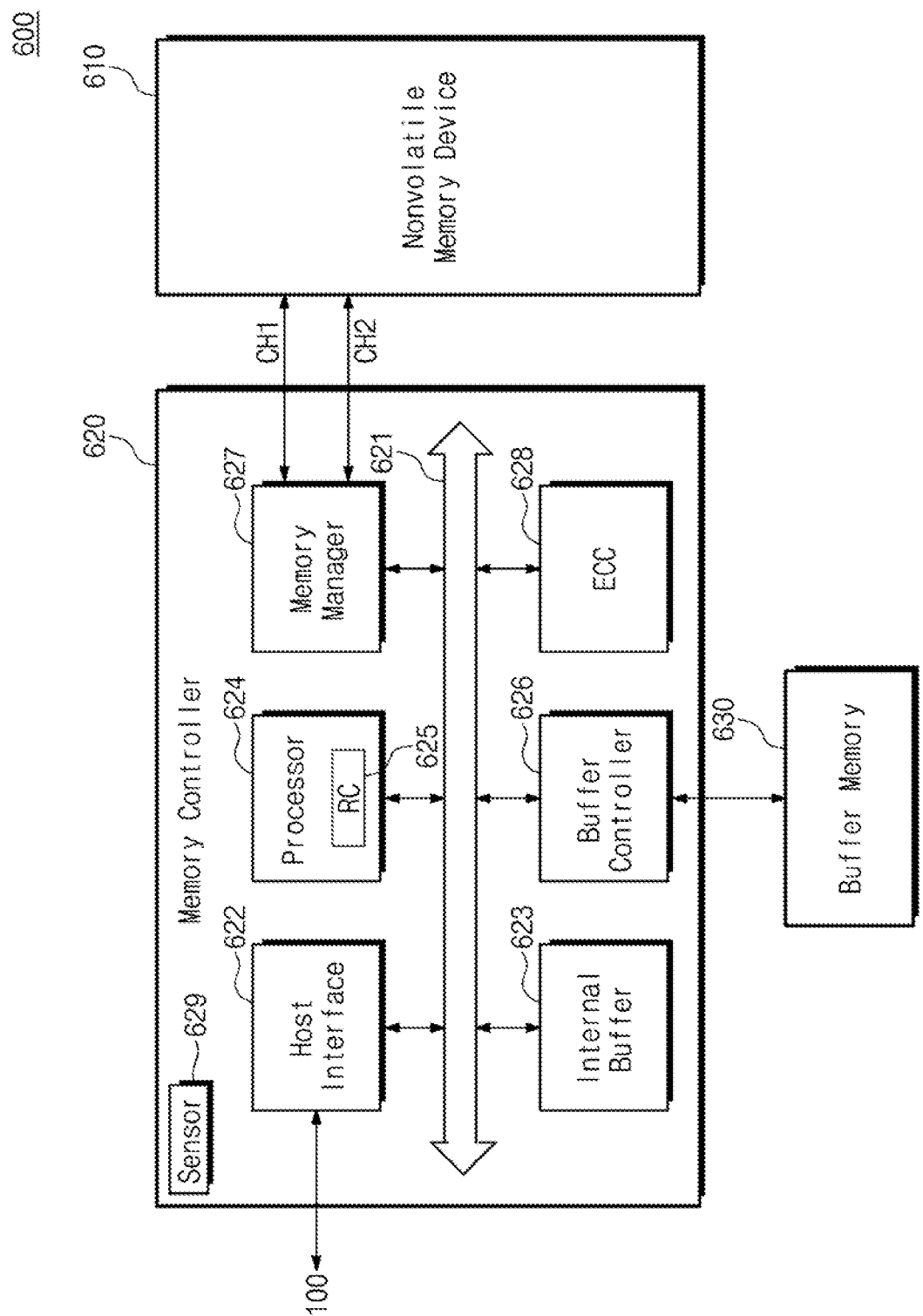
FIG. 16 illustrates an SSD according to an example embodiment.

FIG. 16 illustrates an SSD 600 according to an example embodiment.

Referring to FIG. 16, the SSD 600 may include a nonvolatile memory device 610, a memory controller 620, and a buffer memory 630. The nonvolatile memory device 610 may include a plurality of memory cells. Each of the plurality of memory cells may store two or more bits. For example, the nonvolatile memory device 610 may include at least one of various nonvolatile memory devices such as a flash memory device, a phase change memory device, a ferroelectric memory device, a magnetic memory device, and a resistive memory device.

The memory controller 620 may receive various requests for writing data in the nonvolatile memory device 610 or reading data from the nonvolatile memory device 610 from the electronic device 100. The memory controller 620 may store (or buffer) user data for communication with the electronic device 100 in the buffer memory 630, and may store meta data for managing the SSD 600 in the buffer memory 630.

The memory controller 620 may access the nonvolatile memory device 610 through a first channel CH1 and a second channel CH2. For example, the memory controller 620 may transmit a command and an address to the nonvolatile memory device 610 through the first channel CH1. The memory controller 620 may exchange data with the nonvolatile memory device 610 through the first channel CH1.

The memory controller 620 may transmit a first control signal to the nonvolatile memory device 610 through the second channel CH2. The memory controller 620 may receive a second control signal from the nonvolatile memory device 610 through the second channel CH2.

In an example embodiment, the memory controller 620 may be configured to control two or more nonvolatile memory devices. The memory controller 620 may provide first different channels and second different channels for each of two or more nonvolatile memory devices.

In another example embodiment, the memory controller 620 may share one first channel with respect to two or more nonvolatile memory devices. The memory controller 620 may share a portion of the second channel CH2 with regard to two or more nonvolatile memory devices, and may separately provide the remaining portion thereof.

The buffer memory 630 may include a random access memory. For example, the buffer memory 630 may include at least one of a dynamic random access memory, a phase change random access memory, a ferroelectric random access memory, a magnetic random access memory, or a resistive random access memory.

The memory controller 620 may include a bus 621, a host interface 622, an internal buffer 623, a processor 624, a buffer controller 626, a memory manager 627, and an error correction code (ECC) block 628.

The bus 621 may provide communication channels between components in the memory controller 620. The host interface 622 may receive various requests from the electronic device 100, and may parse the received requests. The host interface 622 may store the parsed requests to the internal buffer 623.

The host interface 622 may transmit various responses to the electronic device 100. The host interface 622 may exchange signals with the electronic device 100 in compliance with a given communication protocol. The internal buffer 623 may include a random access memory. For example, the internal buffer 623 may include a static random access memory or a dynamic random access memory.

The processor 624 may drive an operating system or firmware for driving the memory controller 620. The processor 624 may read the parsed requests stored in the internal buffer 623, and may generate commands and addresses for controlling the nonvolatile memory device 610. The processor 624 may transfer the generated commands and addresses to the memory manager 627.

The processor 624 may store various meta information for managing the SSD 600 to the internal buffer 623. The processor 624 may access the buffer memory 630 through the buffer controller 626. The processor 624 may control the buffer controller 626 and the memory manager 627 such that the user data stored in the buffer memory 630 are transmitted to the nonvolatile memory device 610.

The processor 624 may control the host interface 622 and the buffer controller 626 such that the data stored in the buffer memory 630 are transmitted to the electronic device 100. The processor 624 may control the buffer controller 626 and the memory manager 627 such that data received from the nonvolatile memory device 610 are stored to the buffer memory 630. The processor 624 may control the host interface 622 and the buffer controller 626 such that data received from the electronic device 100 are stored to the buffer memory 630.

The processor 624 may include a retention controller (RC) 625. The retention controller 625 may control the retention recovery operation. The retention recovery operation may include detection read and reclaim. The retention controller 625 may perform the detection read of detecting whether the retention of data written in the nonvolatile memory device 610 is reduced. For example, the retention controller 625 may schedule the detection read in compliance with an internally given algorithm and may perform the scheduled detection read.

In an example embodiment, the retention controller 625 may schedule the detection read based on temperature information obtained by a sensor 629, management information of the nonvolatile memory device 610 including wear information included in metadata, and environment information capable of being transferred from the electronic device 100. When the reduction of retention is detected in the detection read, the retention controller 625 may schedule a reclaim associated with the corresponding data. The reclaim may include general read of reading the corresponding data and general write of writing the read data in any other storage space. The detection read may be performed in a manner different from that of the general read.

In power-on, the retention controller 625 may detect whether power-on is made by the electronic device 100 due to an increase of temperature. For example, when communication initialization is not performed, the retention controller 625 may recognize that the power-on is made due to an increase of temperature. In this case, the retention controller 625 may perform the detection read of the retention recovery operation immediately. In another implementation, in response to a request for retention recovery received from the electronic device 100, the retention controller 625 may perform the detection read of the retention recovery operation.

Under control of the processor 624, the buffer controller 626 may write data in the buffer memory 630 or may read data from the buffer memory 630. The memory manager 627 may communicate with the nonvolatile memory device 610 through the first channel CH1 and the second channel CH2 under control of the processor 624.

The error correction code block 628 may perform error correction encoding on data to be transmitted to the nonvolatile memory device 610 by using an error correction code ECC. The error correction code block 628 may perform error correction decoding on data received from the nonvolatile memory device 610 by using the error correction code ECC.

In an example embodiment, the SSD 600 may not include the buffer memory 630 and the buffer controller 626. When the buffer memory 630 and the buffer controller 626 are not included in the SSD 600, the above functions of the buffer memory 630 and the buffer controller 626 may be performed by the internal buffer 623.

In the above embodiments, components are described by using the terms "first", "second", "third", and the like. However, the terms "first", "second", "third", and the like may be used to distinguish components from each other and conc. For example, the terms "first", "second", "third", and the like do not involve an order or a numerical meaning of any form.

In the above embodiments, components are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

By way of summation and review, a characteristic that data stored in a nonvolatile memory is retained is called "retention". A flash memory may store data in the form of a threshold voltage, and a phase-change memory, a ferroelectric memory, a magnetic memory, and a resistive memory may store data in the form of a resistance value. When a threshold voltage or a resistance value is retained within an intended range in a write operation, the retention may be maintained. When the threshold voltage or the resistance value is out of the intended range over time, the retention may be reduced.

A solid state drive may detect the reduction of retention, and may perform a retention recovery operation of recovering the reduced retention. Through the retention recovery operation, the solid state drive may prevent data stored in the nonvolatile memory from being lost due to the reduction of retention. However, in the case where the solid state drive is left alone in a power-off state, the retention recovery operation may not be performed. This may mean that data stored in the nonvolatile memory is lost due to the reduction of retention.

According to an example embodiment, a solid state drive that is in a high-temperature state where the reduction of retention is accelerated may be powered on, and the powered-on solid state drive may perform a retention recovery operation. Accordingly, a solid state drive preventing a data loss due to the reduction of retention, an electronic device including the solid state drive, and a method of managing the solid state drive are provided.

As described above, embodiments may provide a solid state drive that avoids a retention loss due to an external temperature, an electronic device including the solid state drive, and a method of managing the solid state drive. Embodiments may provide a solid state drive preventing a data loss due to the reduction of retention while left alone in a power-off state, an electronic device including the solid state drive, and a method of managing the solid state drive.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electronic device, comprising:
a power supply configured to supply a first power and a second power;
a first solid state drive (SSD) backplane and a second SSD backplane configured to receive the first power from the power supply, each of the first solid state drive (SSD) backplane and the second SSD backplane including two or more SSDs; and
a baseboard configured to receive the second power from the power supply, to independently power on and power off the first SSD backplane and the second SSD backplane, and to access the SSDs of an SSD backplane that is in a power-on state from among the first SSD backplane and the second SSD backplane,
wherein, in response to an increase in temperature of an SSD backplane that is in a power-off state from among the first SSD backplane and the second SSD backplane, at least one SSD of the SSD backplane that is in the power-off state is powered on.

2. The electronic device as claimed in claim 1, wherein:
each of the first SSD backplane and the second SSD backplane includes a bi-metal, and
the increase in temperature is detected based on the bi-metal.

3. The electronic device as claimed in claim 1, wherein each of the first SSD backplane and the second SSD backplane includes:
a bi-metal disposed adjacent to the SSDs and configured to activate a signal in response to the increase in temperature; and
a regulator configured to receive the first power from the power supply, and to power on or power off the SSDs under control of the baseboard,
wherein the regulator changes a power-off state of an SSD adjacent to the bi-metal to a power-on state in response to the bi-metal activating the signal.

4. The electronic device as claimed in claim 1, wherein the at least one SSD that is powered on performs a retention recovery operation as a background operation.

5. The electronic device as claimed in claim 1, wherein the at least one SSD that is powered on performs a retention recovery operation in response to no communication initialization with the baseboard.

6. The electronic device as claimed in claim 5, wherein:
the baseboard transfers a retention recovery request from the at least one SSD that is powered on, and
the at least one SSD that is powered on performs the retention recovery operation in response to the retention recovery request.

7. The electronic device as claimed in claim 1, further comprising coolers, wherein, in response to the increase in temperature, the baseboard increases cooling by the coolers.

8. The electronic device as claimed in claim 7, wherein a temperature for powering on the at least one SSD and a temperature for increasing the cooling are different.

9. The electronic device as claimed in claim 1, wherein:
each of the first SSD backplane and the second SSD backplane includes a temperature sensor configured to transfer temperature information to the baseboard, and
the increase in temperature is detected based on the temperature information.

10. The electronic device as claimed in claim 1, wherein each of the first SSD backplane and the second SSD backplane includes:
a temperature sensor disposed adjacent to the SSDs and configured to transfer temperature information of the increase in temperature to the baseboard; and
a regulator configured to receive the first power from the power supply, and to power on or power off the SSDs under control of the baseboard,
wherein the baseboard controls the regulator to power on an SSD adjacent to the temperature sensor when the temperature information indicates that the temperature is greater than a critical value.

11. The electronic device as claimed in claim 10, wherein the baseboard adjusts the critical value based on a number of program/erase cycles of a specific SSD of the SSD backplane that is in the power-off state.

12. The electronic device as claimed in claim 11, wherein the baseboard decreases the critical value as the number of program/erase cycles of the specific SSD increases.

13. The electronic device as claimed in claim 11, wherein the baseboard collects the number of program/erase cycles of the specific SSD when powering off the SSD backplane that contains the specific SSD.

14. The electronic device as claimed in claim 11, wherein the baseboard includes a baseboard management controller configured to collect the temperature information and the number of program/erase cycles of the specific SSD through a management interface.

15. The electronic device as claimed in claim 10, wherein, when a time during which the temperature is greater than a cautious temperature value is greater than a threshold time, the baseboard allows the regulator to power on the SSD adjacent to the temperature sensor, the cautious temperature value being less than the critical value.

16. The electronic device as claimed in claim 15, wherein the baseboard is configured to:
increase a count when the temperature is greater than the cautious temperature value, and decrease the count when the temperature is less than the cautious temperature value; and
power on the SSD adjacent to the temperature sensor when the count is greater than the threshold time.

17. The electronic device as claimed in claim 16, wherein the baseboard resets the count when the SSD adjacent to the temperature sensor is powered on.

18. A method of managing a solid state drive (SSD), the method comprising:
powering off the SSD;
powering on the SSD in response to an increase in an ambient temperature of the SSD; and
performing a retention recovery operation at the SSD.

19. The method as claimed in claim 18, further comprising increasing cooling in response to the increase in the ambient temperature of the SSD.

20. A solid state drive, comprising:
a nonvolatile memory device including a plurality of memory blocks each including a plurality of memory cells; and
a controller including a temperature sensor and configured to perform a retention recovery operation on the plurality of memory blocks when a temperature sensed by the temperature sensor is greater than a critical value,
wherein, in a power-on, the controller performs the retention recovery operation in response to no communication initialization with an external host device, or
wherein, after the power-on, the controller performs the retention recovery operation in response to a request of the external host device.

* * * * *